US012683710B2

(12) United States Patent
Horn et al.

(10) Patent No.: US 12,683,710 B2
(45) Date of Patent: Jul. 14, 2026

(54) MULTI-STAGE ERROR CHECKING FOR POLAR-ENCODED CODE BLOCKS

(71) Applicant: QUALCOMM Incorporated, San Diego, CA (US)

(72) Inventors: Idan Michael Horn, Hod Hasharon (IL); Peer Berger, Hod Hasharon (IL); Shay Landis, Hod Hasharon (IL)

(73) Assignee: QUALCOMM Incorporated, San Diego, CA (US)

( * ) Notice: Subject to any disclaimer, the term of this patent is extended or adjusted under 35 U.S.C. 154(b) by 361 days.

(21) Appl. No.: 18/409,236

(22) Filed: Jan. 10, 2024

(65) Prior Publication Data

US 2025/0226916 A1    Jul. 10, 2025

(51) Int. Cl.
| | |
|---|---|
| *H04L 1/00* | (2006.01) |
| *H03M 13/11* | (2006.01) |
| *H04W 28/04* | (2009.01) |

(52) U.S. Cl.
CPC ....... *H04L 1/0057* (2013.01); *H03M 13/1105* (2013.01); *H04L 1/0045* (2013.01); *H04L 1/0061* (2013.01); *H04W 28/04* (2013.01)

(58) Field of Classification Search
CPC ... H04L 1/0057; H04L 1/0045; H04L 1/0061; H04L 1/0075; H03M 13/1105; H03M 13/2906; H03M 13/3707; H03M 13/611; H03M 13/09; H03M 13/13; H04W 28/04
See application file for complete search history.

(56) References Cited

U.S. PATENT DOCUMENTS

| | | | |
|---|---|---|---|
| 9,917,675 B2 | 3/2018 | Kudekar et al. | |
| 2018/0062668 A1* | 3/2018 | Moon | H03M 13/09 |
| 2019/0028119 A1* | 1/2019 | Yang | H03M 13/6306 |

(Continued)

FOREIGN PATENT DOCUMENTS

| | | |
|---|---|---|
| WO | WO-2017209836 | 12/2017 |
| WO | WO-2022150692 A1 | 7/2022 |

OTHER PUBLICATIONS

International Search Report and Written Opinion—PCT/US2024/056477—ISA/EPO—Mar. 10, 2025 (2305880WO).

(Continued)

*Primary Examiner* — Tejis Daya
(74) *Attorney, Agent, or Firm* — Holland & Hart LLP

(57) ABSTRACT

Methods, systems, and devices for wireless communications are described. A network entity may insert one or more error check portions into a polar-encoded signal, where a first error check portion may protect a first portion of the polar-encoded signal. In some examples, a user equipment (UE) may determine a location for the first error check portion based on one or more decoding parameters and may transmit signaling requesting the determined location. The network entity may transmit the polar-encoded signal, and the UE may perform successive cancellation list (SCL) decoding of the polar-encoded signal, determining a first quantity of probable bit sequences for the first portion of the polar-encoded signal. The UE may reduce the SCL list size, make hard decisions on bit values for the first portion, terminate decoding early, or any combination thereof based on the first quantity of probable bit sequences and the first error check portion.

30 Claims, 14 Drawing Sheets

(56)         References Cited

U.S. PATENT DOCUMENTS

2020/0244288 A1 *    7/2020   Noh ................. H03M 13/2792

OTHER PUBLICATIONS

Shen Y., et al., "Low-Latency Segmented List-Pruning Software Polar List Decoder", IEEE Transactions on Vehicular Technology, IEEE, USA, vol. 69, No. 4, Feb. 12, 2020, pp. 3575-3589, Apr. 2020, XP011783945, The Whole Document.

Tong J., et al., "An Asymmetric Adaptive SCL Decoder Hardware for Ultra-Low-Error-Rate Polar Codes", Arxiv.Org, Cornell University Library, 201 Olin Library Cornell University, Ithaca, NY 14853, arXiv:1904.02327v1 [cs.IT], Apr. 4, 2019, 7 Pages, XP081164760, The Whole Document.

Zhou H., et al., "Segmented Successive Cancellation List Polar Decoding with Tailored CRC", Arxiv.Org, Cornell University Library, 201 Olin Library Cornell University, Ithaca, NY 14853, Feb. 22, 2018, arXiv:1803.00521v2 [eess.SP], Mar. 16, 2018, pp. 1-14, XP080861041, The Whole Document.

* cited by examiner

510

520

515

505

500

| Location Request Component | | Polar-Encoded Communication Component |
| 725 | | 730 |
| Signaling Communication Component | | SCL Decoding Component |
| 735 | | 740 |
| Error Check Component | | Location Configuration Component |
| 745 | | 750 |

720

700

130

105

115

Network
Entity

Transceiver

1210

Antenna

1215

Communications
Manager

1220

Memory

Code

1230

1225

1240

Processor

1235

1205

1200

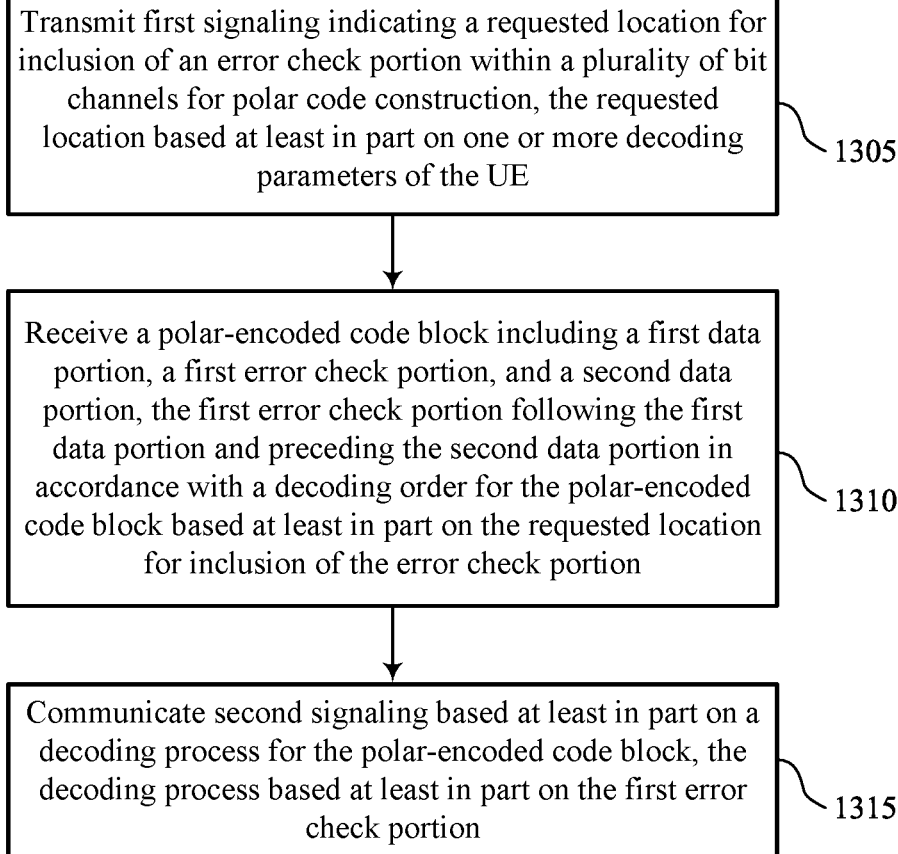

Transmit first signaling indicating a requested location for inclusion of an error check portion within a plurality of bit channels for polar code construction, the requested location based at least in part on one or more decoding parameters of the UE

1305

Receive a polar-encoded code block including a first data portion, a first error check portion, and a second data portion, the first error check portion following the first data portion and preceding the second data portion in accordance with a decoding order for the polar-encoded code block based at least in part on the requested location for inclusion of the error check portion

1310

Communicate second signaling based at least in part on a decoding process for the polar-encoded code block, the decoding process based at least in part on the first error check portion

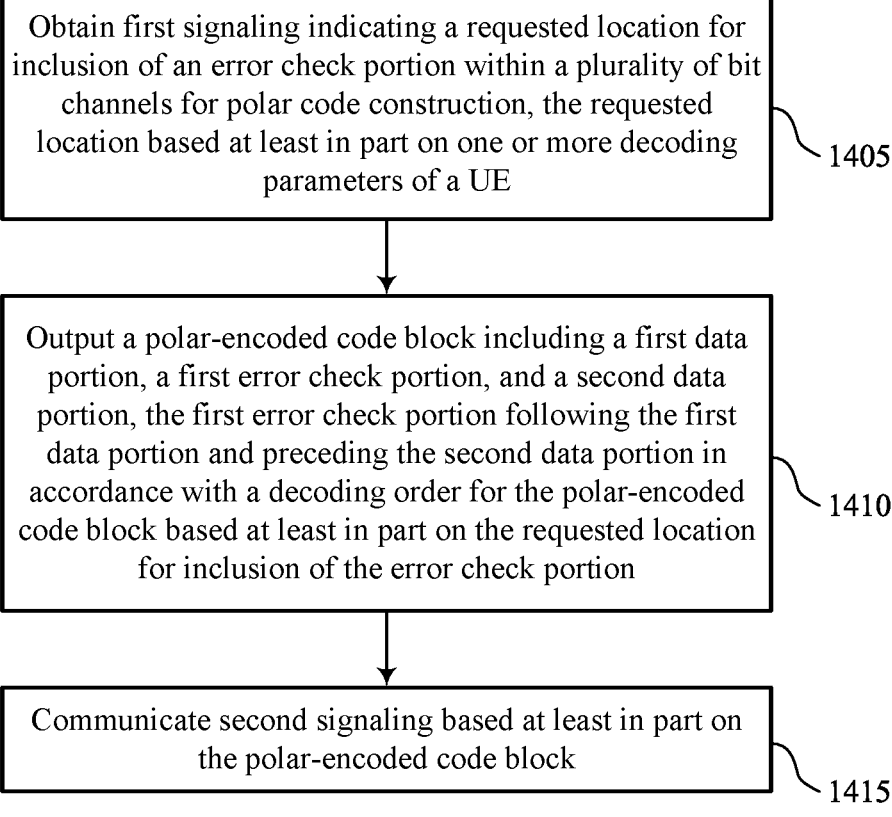

Obtain first signaling indicating a requested location for inclusion of an error check portion within a plurality of bit channels for polar code construction, the requested location based at least in part on one or more decoding parameters of a UE

1405

Output a polar-encoded code block including a first data portion, a first error check portion, and a second data portion, the first error check portion following the first data portion and preceding the second data portion in accordance with a decoding order for the polar-encoded code block based at least in part on the requested location for inclusion of the error check portion

1410

Communicate second signaling based at least in part on the polar-encoded code block

MULTI-STAGE ERROR CHECKING FOR POLAR-ENCODED CODE BLOCKS

TECHNICAL FIELD

The following relates to wireless communications, including multi-stage error checking for polar-encoded code blocks.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

In some wireless communications systems, network entities and UEs may communicate using polar coding techniques. For example, a first device may encode a signal using a polar code, and a second device may receive and decode the signal using the polar code. In some cases, the second device may decode the polar-encoded signal using a successive cancellation list (SCL) decoder, tracking multiple possible decoding paths for the polar-encoded signal. Such a decoding process may introduce significant complexity at the decoding device, resulting in a relatively high processing overhead associated with decoding polar-encoded signals.

SUMMARY

The described techniques relate to improved methods, systems, devices, and apparatuses that support multi-stage error checking for polar-encoded code blocks. For example, the described techniques provide for a first device (e.g., a network entity or other device) transmitting a polar-encoded signal to insert one or more error check portions into the polar-encoded signal at one or more corresponding locations indicated by a second device (e.g., a user equipment (UE) or other device) receiving the polar-encoded signal. For example, the first device may generate the polar-encoded signal to include a first data portion followed by a first error check portion providing protection (e.g., a first cyclic redundancy check (CRC) or other protection) for the first data portion. The second device may determine a device-specific location for inserting the first error check portion within the polar-encoded signal based on one or more decoding parameters of the second device (e.g., of the receiver or transceiver of the second device) and may transmit signaling requesting this location for the first error check portion. The first device may generate the polar-encoded signal based on the location requested by the second device for the first error check portion. In some cases, the first device may include one or more additional error check portions within the polar-encoded signal, such as a second error check portion at the end of the polar-encoded signal.

The first device (e.g., the network entity or other device) may transmit the polar-encoded signal, and the second device (e.g., the UE or other device) may receive the polar-encoded signal. The second device may perform successive cancellation list (SCL) decoding on the polar-encoded signal. The second device may determine a first quantity of probable bit sequences (e.g., decoding paths) for the first data portion of the received polar-encoded signal, the first quantity corresponding to a list size of the SCL decoder at the second device. The second device may perform a first error check on the first quantity of probable bit sequences using the first error check portion. In some examples, the second device may use a second quantity of probable bit sequences for a second data portion of the polar-encoded message following the first error check portion (e.g., a remaining portion of the received polar-encoded signal after the first error check portion). In some cases, the second device may use an increased list size (e.g., as compared to a default list size for the SCL decoder) for decoding the first data portion to improve a decoding performance of the second device. Additionally, or alternatively, the second device may use a decreased list size (e.g., as compared to the default list size for the SCL decoder) for decoding the second data portion to improve the decoding complexity (e.g., reducing the latency, reducing the processing overhead) for the decoding process.

A method for wireless communication by a UE is described. The method may include transmitting first signaling indicating a requested location for inclusion of an error check portion within a set of multiple bit channels for polar code construction, the requested location based on one or more decoding parameters of the UE, receiving a polar-encoded code block including a first data portion, a first error check portion, and a second data portion, the first error check portion following the first data portion and preceding the second data portion in accordance with a decoding order for the polar-encoded code block based on the requested location for inclusion of the error check portion, and communicating second signaling based on a decoding process for the polar-encoded code block, the decoding process based on the first error check portion.

A UE is described. The UE may include one or more memories storing processor executable code and one or more processors coupled with (e.g., operatively, communicatively, functionally, electronically, or electrically) the one or more memories. The one or more processors may be individually or collectively operable to execute the code (e.g., directly, indirectly, after pre-processing, without pre-processing) to cause the UE to transmit first signaling indicating a requested location for inclusion of an error check portion within a set of multiple bit channels for polar code construction, the requested location based on one or more decoding parameters of the UE, receive a polar-encoded code block including a first data portion, a first error check portion, and a second data portion, the first error check portion following the first data portion and preceding the second data portion in accordance with a decoding order for the polar-encoded code block based on the requested location for inclusion of the error check portion, and communicate second signaling based on a decoding process for the polar-encoded code block, the decoding process based on the first error check portion.

Another UE for wireless communication is described. The UE may include means for transmitting first signaling indicating a requested location for inclusion of an error check portion within a set of multiple bit channels for polar code construction, the requested location based on one or more decoding parameters of the UE, means for receiving a polar-encoded code block including a first data portion, a first error check portion, and a second data portion, the first error check portion following the first data portion and preceding the second data portion in accordance with a decoding order for the polar-encoded code block based on the requested location for inclusion of the error check portion, and means for communicating second signaling based on a decoding process for the polar-encoded code block, the decoding process based on the first error check portion.

A non-transitory computer-readable medium storing code for wireless communication is described. The code may include instructions executable by one or more processors (e.g., directly, indirectly, after pre-processing, without pre-processing) to transmit first signaling indicating a requested location for inclusion of an error check portion within a set of multiple bit channels for polar code construction, the requested location based on one or more decoding parameters of the UE, receive a polar-encoded code block including a first data portion, a first error check portion, and a second data portion, the first error check portion following the first data portion and preceding the second data portion in accordance with a decoding order for the polar-encoded code block based on the requested location for inclusion of the error check portion, and communicate second signaling based on a decoding process for the polar-encoded code block, the decoding process based on the first error check portion.

Some examples of the method, UEs, and non-transitory computer-readable medium described herein may further include operations, features, means, or instructions for decoding the first data portion according to a set of multiple decoding paths corresponding to a first list size for SCL decoding and performing an error check for the first data portion using the first error check portion.

Some examples of the method, UEs, and non-transitory computer-readable medium described herein may further include operations, features, means, or instructions for decoding the second data portion according to one or more decoding paths corresponding to a second list size different from the first list size for the SCL decoding based on the error check for the first data portion.

Some examples of the method, UEs, and non-transitory computer-readable medium described herein may further include operations, features, means, or instructions for selecting, from the set of multiple decoding paths, a decoding path for the first data portion based on the error check for the first data portion and decoding the second data portion based on the selected decoding path for the first data portion.

Some examples of the method, UEs, and non-transitory computer-readable medium described herein may further include operations, features, means, or instructions for terminating the decoding process for the polar-encoded code block based on the set of multiple decoding paths failing the error check for the first data portion.

Some examples of the method, UEs, and non-transitory computer-readable medium described herein may further include operations, features, means, or instructions for reducing a quantity of bits associated with one or more log-likelihood ratio (LLR) calculations for the decoding process based on the error check for the first data portion.

In some examples of the method, UEs, and non-transitory computer-readable medium described herein, the polar-encoded code block further includes a second error check portion following the second data portion in accordance with the decoding order for the polar-encoded code block and the decoding process may be further based on the second error check portion.

In some examples of the method, UEs, and non-transitory computer-readable medium described herein, transmitting the first signaling may include operations, features, means, or instructions for transmitting an indication of a capability of the UE to decode the polar-encoded code block including multiple error check portions, where the polar-encoded code block includes the first error check portion and the second error check portion based on the capability of the UE.

In some examples of the method, UEs, and non-transitory computer-readable medium described herein, transmitting the first signaling may include operations, features, means, or instructions for transmitting a request for inclusion of the second error check portion for the polar code construction, where the polar-encoded code block includes the second error check portion based on the request.

In some examples of the method, UEs, and non-transitory computer-readable medium described herein, the second error check portion verifies successful decoding of the first data portion, the second data portion, the first error check portion, or any combination thereof.

In some examples of the method, UEs, and non-transitory computer-readable medium described herein, transmitting the first signaling may include operations, features, means, or instructions for transmitting an indication for the second error check portion to verify the first data portion, the second data portion, the first error check portion, or any combination thereof.

In some examples of the method, UEs, and non-transitory computer-readable medium described herein, transmitting the first signaling may include operations, features, means, or instructions for transmitting an indication of a first quantity of bits for the error check portion, a second quantity of bits for a second error check portion, a total quantity of bits for a set of multiple error check portions, or any combination thereof, where the polar-encoded code block may be based on the first quantity of bits, the second quantity of bits, the total quantity of bits, or any combination thereof.

In some examples of the method, UEs, and non-transitory computer-readable medium described herein, the first quantity of bits, the second quantity of bits, the total quantity of bits, or any combination thereof may be based on a list size for SCL decoding at the UE.

In some examples of the method, UEs, and non-transitory computer-readable medium described herein, transmitting the first signaling may include operations, features, means, or instructions for transmitting an indication of a set of multiple candidate locations for inclusion of the error check portion and corresponding reductions in power consumption for the decoding process, the set of multiple candidate locations including the requested location.

Some examples of the method, UEs, and non-transitory computer-readable medium described herein may further include operations, features, means, or instructions for receiving third signaling configuring a location for the error check portion within the set of multiple bit channels for the polar code construction based on the requested location, where the polar-encoded code block includes the first error check portion based on the configured location.

Some examples of the method, UEs, and non-transitory computer-readable medium described herein may further include operations, features, means, or instructions for receiving third signaling configuring a location for the error check portion within the set of multiple bit channels for the polar code construction, where the first signaling may be transmitted to request an update to the configured location.

In some examples of the method, UEs, and non-transitory computer-readable medium described herein, the first signaling indicates the requested location based on a lookup table index, a bit channel index, a proportion of the set of multiple bit channels, or any combination thereof.

In some examples of the method, UEs, and non-transitory computer-readable medium described herein, the one or more decoding parameters include a list size for SCL decoding, a code rate for communications, a rank for communications, or any combination thereof.

In some examples of the method, UEs, and non-transitory computer-readable medium described herein, the first error check portion includes one or more CRC bits.

A method for wireless communications by a network entity is described. The method may include obtaining (e.g., receiving) first signaling indicating a requested location for inclusion of an error check portion within a set of multiple bit channels for polar code construction, the requested location based on one or more decoding parameters of a UE, outputting (e.g., transmitting) a polar-encoded code block including a first data portion, a first error check portion, and a second data portion, the first error check portion following the first data portion and preceding the second data portion in accordance with a decoding order for the polar-encoded code block based on the requested location for inclusion of the error check portion, and communicating (e.g., obtaining, outputting, receiving, transmitting) second signaling based on the polar-encoded code block.

A network entity is described. The network entity may include one or more memories storing processor executable code and one or more processors coupled with (e.g., operatively, communicatively, functionally, electronically, or electrically) the one or more memories. The one or more processors may be individually or collectively operable to execute the code (e.g., directly, indirectly, after pre-processing, without pre-processing) to cause the network entity to obtain first signaling indicating a requested location for inclusion of an error check portion within a set of multiple bit channels for polar code construction, the requested location based on one or more decoding parameters of a UE, output a polar-encoded code block including a first data portion, a first error check portion, and a second data portion, the first error check portion following the first data portion and preceding the second data portion in accordance with a decoding order for the polar-encoded code block based on the requested location for inclusion of the error check portion, and communicate second signaling based on the polar-encoded code block.

Another network entity for wireless communications is described. The network entity may include means for obtaining first signaling indicating a requested location for inclusion of an error check portion within a set of multiple bit channels for polar code construction, the requested location based on one or more decoding parameters of a UE, means for outputting a polar-encoded code block including a first data portion, a first error check portion, and a second data portion, the first error check portion following the first data portion and preceding the second data portion in accordance with a decoding order for the polar-encoded code block based on the requested location for inclusion of the error check portion, and means for communicating second signaling based on the polar-encoded code block.

A non-transitory computer-readable medium storing code for wireless communications is described. The code may include instructions executable by one or more processors (e.g., directly, indirectly, after pre-processing, without pre-processing) to obtain first signaling indicating a requested location for inclusion of an error check portion within a set of multiple bit channels for polar code construction, the requested location based on one or more decoding parameters of a UE, output a polar-encoded code block including a first data portion, a first error check portion, and a second data portion, the first error check portion following the first data portion and preceding the second data portion in accordance with a decoding order for the polar-encoded code block based on the requested location for inclusion of the error check portion, and communicate second signaling based on the polar-encoded code block.

Some examples of the method, network entities, and non-transitory computer-readable medium described herein may further include operations, features, means, or instructions for selecting a location for the error check portion within the set of multiple bit channels for the polar code construction based on the requested location and outputting third signaling configuring the location for the error check portion based on the selecting, where the polar-encoded code block includes the first error check portion based on the configured location.

In some examples of the method, network entities, and non-transitory computer-readable medium described herein, obtaining the first signaling may include operations, features, means, or instructions for obtaining an indication of a set of multiple candidate locations for inclusion of the error check portion and corresponding reductions in power consumption at the UE, the set of multiple candidate locations including the requested location, where the location may be selected based on the set of multiple candidate locations, the reductions in power consumption, or both.

In some examples of the method, network entities, and non-transitory computer-readable medium described herein, the polar-encoded code block further includes a second error check portion following the second data portion in accordance with the decoding order for the polar-encoded code block.

Some examples of the method, network entities, and non-transitory computer-readable medium described herein may further include operations, features, means, or instructions for selecting a first quantity of bits for the first error check portion, a second quantity of bits for the second error check portion, or both, where the polar-encoded code block may be based on the first quantity of bits, the second quantity of bits, or both.

In some examples of the method, network entities, and non-transitory computer-readable medium described herein, obtaining the first signaling may include operations, features, means, or instructions for obtaining an indication of the first quantity of bits, the second quantity of bits, a total quantity of bits for a set of multiple error check portions, or any combination thereof, where the selecting may be based on the first quantity of bits, the second quantity of bits, the total quantity of bits, or any combination thereof.

Some examples of the method, network entities, and non-transitory computer-readable medium described herein may further include operations, features, means, or instructions for obtaining third signaling indicating that a second UE uses a successive cancellation decoder with a single decoding path and selecting a location for the error check portion for the second UE based on the second UE using the successive cancellation decoder with the single decoding path.

In some examples of the method, network entities, and non-transitory computer-readable medium described herein, the first error check portion includes one or more CRC bits.

BRIEF DESCRIPTION OF THE DRAWINGS

FIGS. 13 and 14 show flowcharts illustrating methods that support multi-stage error checking for polar-encoded code blocks in accordance with one or more aspects of the present disclosure.

DETAILED DESCRIPTION

Figure 1:
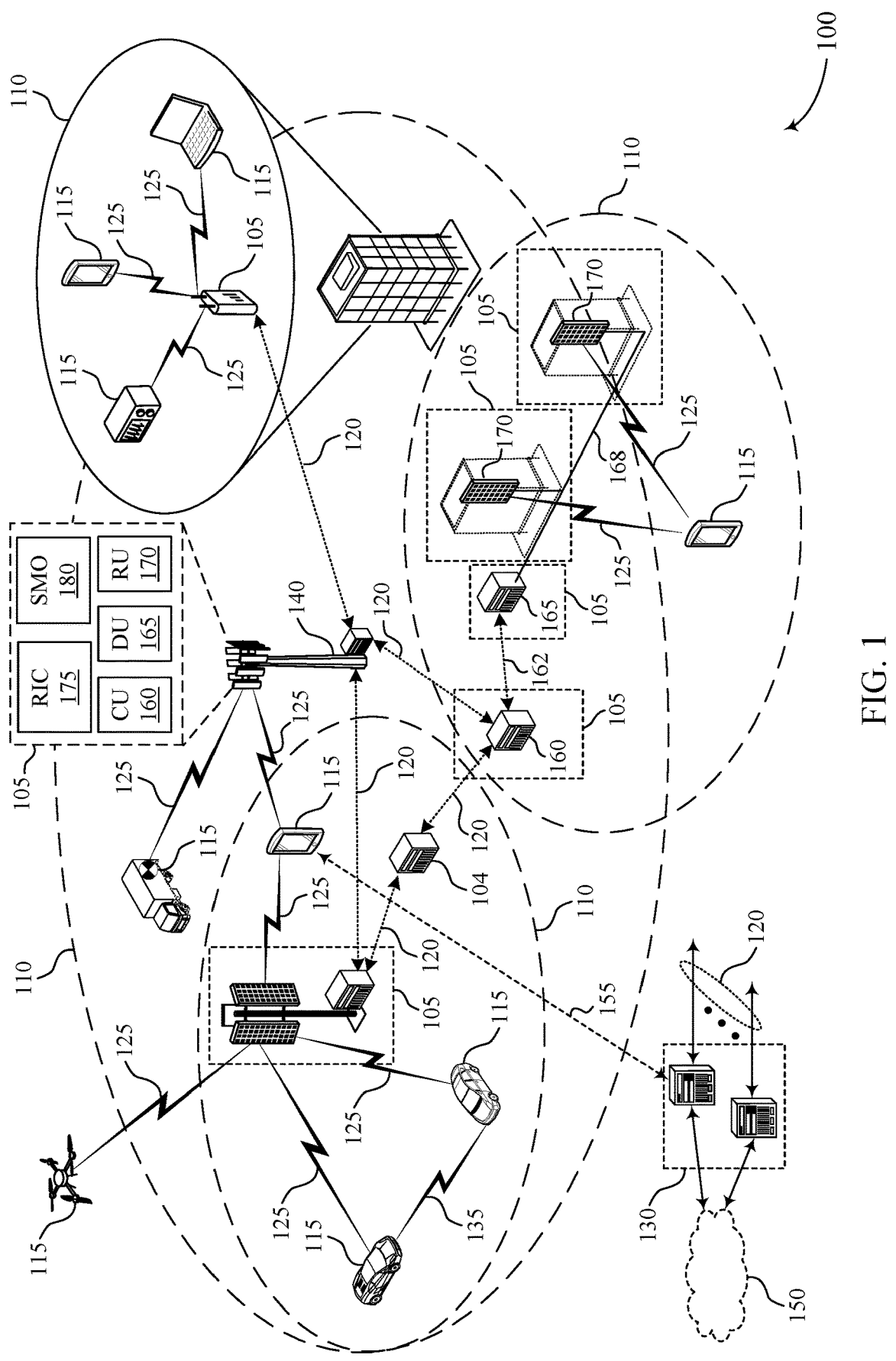
FIG. 1 shows an example of a wireless communications system that supports multi-stage error checking for polar-encoded code blocks in accordance with one or more aspects of the present disclosure.

Some wireless communications systems may utilize polar-encoded signaling (e.g., code blocks) for communicating data. In some cases, to decode a polar-encoded signal, a receiver (e.g., receiving device, such as a user equipment (UE) or network entity) in the wireless communications system may utilize a successive cancellation list (SCL) decoder, which may determine multiple probable bit sequences (e.g., decoding paths) for decoding the polar-encoded signal. The SCL decoder may track a quantity of decoding paths according to a list size (e.g., a default list size, an active list size) of the SCL decoder. In some cases, a probability of the receiving device decoding a bit of a first portion of the polar-encoded signal in error may be relatively higher than a probability of the receiving device decoding a bit of a second portion of the polar-encoded signal in error based on the polarization of the bit channels of the polar-encoded signal. For example, the probability of incorrectly decoding a bit in the second portion of the signal may be negligible (e.g., close to or equal to zero) based on the preceding bits improving the reliability of the bits in the second portion of the signal. In some cases, the second portion may be approximately the latter half of the received polar-encoded signal. In some examples, a transmitting device may implement forward error correction (FEC) by appending an error check portion (e.g., cyclic redundancy check (CRC) bits) to the end of the polar-encoded signal, where the receiving device may check if one of the probable bit sequences is correct (e.g., passes the CRC) using the appended error check portion. In some cases, the use of an SCL decoder with a relatively large list size may decrease a block error rate (BLER) but may increase a complexity (e.g., processing overhead) of the receiver (e.g., decoder).

According to techniques described herein, a first device (e.g., a network entity) transmitting a polar-encoded signal may insert one or more error check portions into the polar-encoded signal at one or more corresponding locations indicated by a second device (e.g., a UE) receiving the polar-encoded signal. For example, the first device may insert a first error check portion at an end of a first data portion of the polar-encoded signal, the first data portion indicated by the second device. The first error check portion of the one or more error check portions may be for (e.g., protect) the first data portion of the polar-encoded signal. The receiving device (e.g., a UE, a decoder) may determine a device-specific location for inserting the first error check portion based on one or more decoding parameters of the receiving device (e.g., of the device's receiver) and may transmit signaling requesting this location for the first error check portion.

The receiving device may perform SCL decoding on the polar-encoded signal. The SCL decoding may involve determining a first quantity of probable bit sequences (e.g., decoding paths) for the first portion of the received polar-encoded signal and determining a second quantity of probable bit sequences for a second portion of the polar-encoded signal (e.g., a remaining portion of the received polar-encoded signal after the first error check portion). In some cases, the first portion may be one eighth, one fourth, three eighths, one half, or some other proportion of the polar-encoded signal. In some cases, the first quantity of decoding paths may be relatively larger than the second quantity of decoding paths. The receiving device may effectively decode the first portion based on the first quantity of decoding paths being relatively large. Additionally, or alternatively, the receiving device may experience an improved complexity (e.g., reduced latency, reduced power use) of decoding the second portion due to the second quantity of decoding paths being relatively small. As used herein, the term "code block" or "polar-encoded code block" may refer to any size or type of signaling (e.g., transfer block, symbol, signal, resource block), including a code block.

Aspects of the disclosure are initially described in the context of wireless communications systems. Aspects of the disclosure are further described in the context of bit error distribution diagrams, polar code construction processes, and process flows. Aspects of the disclosure are further illustrated by and described with reference to apparatus diagrams, system diagrams, and flowcharts that relate to multi-stage error checking for polar-encoded code blocks.

FIG. 1 shows an example of a wireless communications system 100 that supports multi-stage error checking for polar-encoded code blocks in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be capable of supporting communications with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, or computing system may include disclosure of the UE 115, network entity 105, apparatus, device, or computing system being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities

105 may communicate with one another via a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 via a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending on which functions (e.g., network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication via such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

In the case of the techniques described herein applied in the context of a disaggregated RAN architecture, one or more components of the disaggregated RAN architecture may be configured to support multi-stage error checking for polar-encoded code blocks as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180). Components within a wireless communication system may be coupled (for example, operatively, communicatively, functionally, electronically, and/or electrically) to each other.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a multimedia/entertainment device (e.g., a radio, a MP3 player, or a video device), a camera, a gaming device, a navigation/positioning device (e.g., GNSS (global navigation satellite system) devices based on, for example, GPS (global positioning system), Beidou, GLONASS, or Galileo, or a terrestrial-based device), a tablet computer, a laptop computer, a netbook, a smartbook, a personal computer, a smart device, a wearable device (e.g., a smart watch, smart clothing, smart glasses, virtual reality goggles, a smart wristband, smart jewelry (e.g., a smart ring, a smart bracelet)), a drone, a robot/robotic device, a vehicle, a vehicular device, a meter (e.g., parking meter, electric meter, gas meter, water meter), a monitor, a gas pump, an appliance (e.g., kitchen appliance, washing machine, dryer), a location tag, a medical/healthcare device, an implant, a sensor/actuator, a display, or any other suitable device configured to communicate via a wireless or wired medium. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) using resources associated with one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

In some examples, such as in a carrier aggregation configuration, a carrier may also have acquisition signaling or control signaling that coordinates operations for other carriers. A carrier may be associated with a frequency channel (e.g., an evolved universal mobile telecommunication system terrestrial radio access (E-UTRA) absolute RF channel number (EARFCN)) and may be identified according to a channel raster for discovery by the UEs 115. A carrier may be operated in a standalone mode, in which case initial acquisition and connection may be conducted by the UEs 115 via the carrier, or the carrier may be operated in a non-standalone mode, in which case a connection is anchored using a different carrier (e.g., of the same or a different radio access technology).

The communication links 125 shown in the wireless communications system 100 may include downlink transmissions (e.g., forward link transmissions) from a network entity 105 to a UE 115, uplink transmissions (e.g., return link transmissions) from a UE 115 to a network entity 105, or both, among other configurations of transmissions. Carriers may carry downlink or uplink communications (e.g., in an FDD mode) or may be configured to carry downlink and uplink communications (e.g., in a TDD mode).

A carrier may be associated with a particular bandwidth of the RF spectrum and, in some examples, the carrier bandwidth may be referred to as a "system bandwidth" of the carrier or the wireless communications system 100. For example, the carrier bandwidth may be one of a set of bandwidths for carriers of a particular radio access technology (e.g., 1.4, 3, 5, 10, 15, 20, 40, or 80 megahertz (MHz)). Devices of the wireless communications system 100 (e.g., the network entities 105, the UEs 115, or both) may have hardware configurations that support communications using a particular carrier bandwidth or may be configurable to support communications using one of a set of carrier bandwidths. In some examples, the wireless communications system 100 may include network entities 105 or UEs 115 that support concurrent communications using carriers associated with multiple carrier bandwidths. In some examples, each served UE 115 may be configured for operating using portions (e.g., a sub-band, a BWP) or all of a carrier bandwidth.

Signal waveforms transmitted via a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both), such that a relatively higher quantity of resource elements (e.g., in a transmission duration) and a relatively higher order of a modulation scheme may correspond to a relatively higher rate of communication. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

One or more numerologies for a carrier may be supported, and a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the network entities 105 or the UEs 115 may be expressed in multiples of a basic time unit which may, for example, refer to a sampling period of $Ts=1/(\Delta f_{max} \cdot N_f)$ seconds, for which $\Delta f_{max}$ may represent a supported subcarrier spacing, and $N_f$ may represent a supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively-numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots associated with one or more symbols. Excluding the cyclic prefix, each symbol period may be associated with one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (STTIs)).

Physical channels may be multiplexed for communication using a carrier according to various techniques. A physical control channel and a physical data channel may be multiplexed for signaling via a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be configured to support communicating directly with other UEs 115 via a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by (e.g., scheduled by) the network entity 105. In some examples, one or more UEs 115 of such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without an involvement of a network entity 105.

The core network 130 may provide user authentication, access authorization, tracking, Internet Protocol (IP) connectivity, and other access, routing, or mobility functions. The core network 130 may be an evolved packet core (EPC)

or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. UHF waves may be blocked or redirected by buildings and environmental features, which may be referred to as clusters, but the waves may penetrate structures sufficiently for a macro cell to provide service to the UEs 115 located indoors. Communications using UHF waves may be associated with smaller antennas and shorter ranges (e.g., less than 100 kilometers) compared to communications using the smaller frequencies and longer waves of the high frequency (HF) or very high frequency (VHF) portion of the spectrum below 300 MHz.

The wireless communications system 100 may also operate using a super high frequency (SHF) region, which may be in the range of 3 GHz to 30 GHz, also known as the centimeter band, or using an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the network entities 105 (e.g., base stations 140, RUs 170), and EHF antennas of the respective devices may be smaller and more closely spaced than UHF antennas. In some examples, such techniques may facilitate using antenna arrays within a device. The propagation of EHF transmissions, however, may be subject to even greater attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology using an unlicensed band such as the 5 GHz industrial, scientific, and medical (ISM) band. While operating using unlicensed RF spectrum bands, devices such as the network entities 105 and the UEs 115 may employ carrier sensing for collision detection and avoidance. In some examples, operations using unlicensed bands may be based on a carrier aggregation configuration in conjunction with component carriers operating using a licensed band (e.g., LAA). Operations using unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located at diverse geographic locations. A network entity 105 may include an antenna array with a set of rows and columns of antenna ports that the network entity 105 may use to support beamforming of communications with a UE 115. Likewise, a UE 115 may include one or more antenna arrays that may support various MIMO or beamforming operations. Additionally, or alternatively, an antenna panel may support RF beamforming for a signal transmitted via an antenna port.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating along particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

According to techniques described herein, a network entity 105 (e.g., a transmitter, an encoder) may insert one or more error check portions into a polar-encoded signal at one or more corresponding locations in the polar-encoded signal indicated by a UE 115 (e.g., a receiver, a decoder), where a first error check portion of the one or more error check portions may be for a first portion of the polar-encoded signal. The UE 115 may determine device-specific locations for inserting the one or more error check portions based on one or more decoding parameters of the UE 115 and may transmit signaling requesting the one or more locations for the error check portions.

Additionally, the UE 115 may perform SCL decoding on the polar-encoded signal by determining a first quantity of probable bit sequences (e.g., a first quantity of decoding paths according to a first list size for the SCL decoding) for the first portion of the received polar-encoded message and determining a second quantity of probable bit sequences (e.g., a second quantity of decoding paths according to a second list size) for a second portion of the polar-encoded message. In some cases, the first portion may span one eighth, one fourth, three eighths, one half, or some other proportion of the polar-encoded message. In some cases, the first quantity of decoding paths may be relatively larger than the second quantity of decoding paths.

Figure 2:
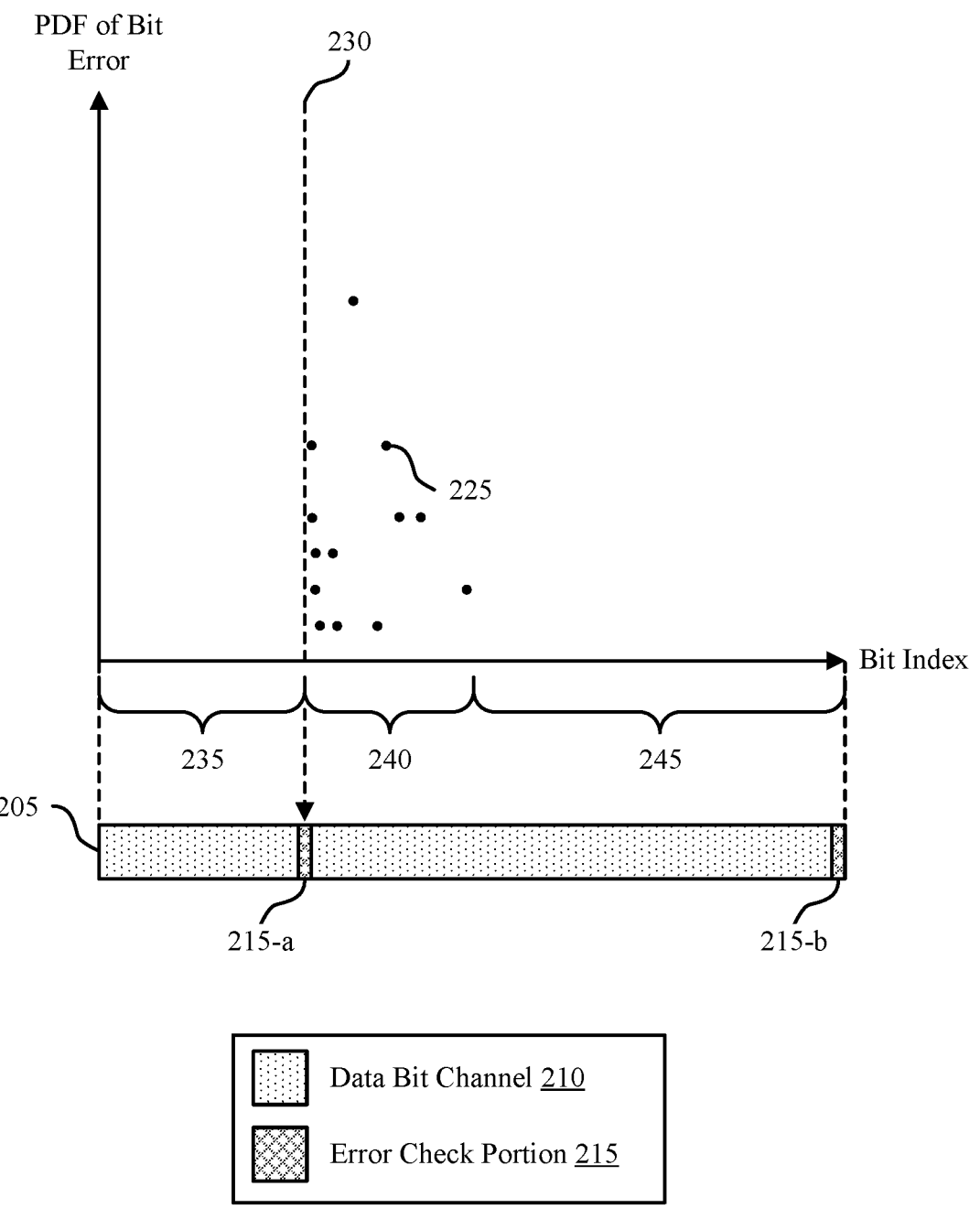
FIG. 2 shows an example of a bit error distribution diagram that supports multi-stage error checking for polar-encoded code blocks in accordance with one or more aspects of the present disclosure.

FIG. 2 shows an example of a bit error distribution diagram 200 that supports multi-stage error checking for polar-encoded code blocks in accordance with one or more aspects of the present disclosure. In some cases, aspects of the bit error distribution diagram 200 may implement or be implemented by aspects of the wireless communications system 100, as described with reference to FIG. 1. For example, the bit error distribution diagram 200 may represent bit error probabilities for a polar-encoded code block 205, which may be an example or component of a polar-encoded message or signal as described herein with respect to FIG. 1. In some cases, the bit error distribution diagram 200 may support multi-stage error checking for the polar-encoded code block 205.

In some wireless communications systems, communications from a wireless device may be associated with a constellation (e.g., a quantity of bits of information per resource element). In some cases, the constellation of a communication may be quadrature phase shift keying (QPSK) (e.g., 2 bits of information per resource element), which may have similar characteristics as binary phase shift keying (BPSK) (e.g., 1 bit of information per resource element). QPSK may be a generalization or Cartesian product of BPSK in two dimensions (e.g., phase and amplitude). In some cases, QPSK may provide no difference in a level of quality (e.g., protection) for different bits of a code block.

In some wireless communications systems (e.g., 5G wireless communications systems, 6G wireless communications systems, or other wireless communications systems), wireless devices may use polar encoding of code blocks (e.g., polar codes) as an error correcting code for transmissions (e.g., physical downlink control channel (PDCCH) transmissions, physical downlink shared channel (PDSCH) transmissions, uplink transmissions, sidelink transmissions, backhaul transmissions, or any combination thereof). In some examples, devices may use polar coding for communications associated with relatively higher constellations (e.g., more bits per resource element) than QPSK.

Some coding schemes may be referred to as equalized coding schemes (e.g., coding schemes that treats each bit of a signal with equal priority for decoding reliability) and may result in a relatively high communication reliability. For example, bit-interleaved coded modulation (BICM) may implement an equalized coding scheme. However, polar coding may rely on a polarization phenomenon, where different bits of a polar-encoded signal may be associated with different levels of reliability (e.g., protection). A code rate for the polar-encoded signal may be determined by communicating information in bit channels with relatively high levels of reliability (e.g., above a threshold), while maintaining the other bits as zeros (e.g., freezing the other bits).

As opposed to some other coding schemes, an input and an output of a polar encoder may be of a same length (e.g., quantity of bits, N). In some cases, a basic coding scheme used in polar coding may be referred to as a [u+v, v] kernel. A [u+v, v] kernel may encode, for example, 2 bits, according to the following equations:

$$G_{[u+v,v]2} = F_{u+v,v} = \begin{bmatrix} 1 & 0 \\ 1 & 1 \end{bmatrix}, \tag{1}$$

-continued $$U_1^2 \cdot G_2 = X_1^2, \text{ and} \tag{2}$$

$$X_1^2 \rightarrow W_1^2 \rightarrow Y_1^2, \tag{3}$$

where G represents a generator matrix, F represents a function (e.g., a recursive function), U represents the input bits (e.g., a vector of multiple bits, $u_i$) with equal probabilities, X represents encoded bits with polarized probabilities, W represents a mapping from X to Y, and Y represents the output (e.g., polarized) bits in respective bits channels. To generalize, an encoder may encode N bits according to the following equations:

$$G_{[u+v,v]2} = B_{[binary]N} \cdot F_{u+v,v}^{\otimes n}, \tag{4}$$

$$U_0^{N-1} \cdot G_N = X_0^{N-1}, \text{ and} \tag{5}$$

$$X_0^{N-1} \rightarrow W_0^{N-1} \rightarrow Y_0^{N-1}, \tag{6}$$

where B represents a bit-reversal operator. In some cases, combining polar coding with other coding schemes (e.g., multi-level coding (MLC)) and relatively higher constellations (e.g., 256 quadrature amplitude modulation (256QAM)) may result in increases in gains associated with wireless communications (e.g., as compared to a BICM scheme).

Polar coding may utilize the polarization phenomenon of bit channels, which may result from applying one or more of Equations 1-6 to 2 or more bit channels. In some cases, the polarization phenomenon may cause one or more bit channels of a polar-encoded code block to be relatively more reliable (e.g., protected, with a bit error rate (BER) of approximately 0 and a capacity of approximately 1) and one or more other bit channels of the polar-encoded code block to be relatively less reliable (e.g., less protected, with a BER of approximately 0.5 and a capacity of approximately 0). In some cases, a device that is generating and transmitting a polar-encoded code block may be referred to as an encoder (e.g., a network entity 105, a UE 115). In some cases, the encoder may sort (e.g., assign) the indexes of the N bit channels of a code block based on respective channel capacities of the bit channels. For example, to transmit a polar-encoded code block of size N with a data rate of R indicating a proportion of bit channels used for sending information (e.g., as opposed to sending frozen bits) versus the total number of bit channels, the encoder may transmit data via K bit channels (e.g., K reliable bit channels, the K relatively highest or maximal capacity bit channels, the K relatively lowest or minimum BER bit channels) of the polar-encoded code block, such that K/N=R. In the other N−K bit channels, the encoder may transmit fixed values known to the decoder (e.g., frozen bits indicating a value of 0).

In some cases, a device that receives and decodes a polar-encoded code block may be referred to as a decoder (e.g., a UE 115, a network entity 105). In some cases, to decode the polar-encoded code block, the decoder may utilize an SCL decoder, which may determine a quantity (e.g., a list of a specific size) of probable bit sequences (e.g., routes, decoding paths) of the polar-encoded signal. In some examples, the SCL decoder may also perform an error check on the quantity of probable bit sequences of the polar-encoded code block based on an error check portion associated with the polar-encoded code block (e.g., at the end of the code block, at the end of a transfer block including the code block). If one of the probable bit sequences passes the error check, the decoder may determine that this bit sequence is the correctly decoded bit sequence for the polar-encoded code block. In some cases, the decoder may utilize the SCL decoder based on a relatively low BLER associated with SCL decoders (e.g., based on tracking multiple decoding paths to reduce the effect of decoding errors).

In some examples, an encoder may utilize polar coding with one or more other coding schemes (e.g., MLC, BICM). For example, MLC may be a coding scheme associated with a relatively high capacity, and may treat each bit (e.g., bit channel) of a code block with an appropriate and corresponding data rate (e.g., based on an associated channel capacity and a constellation associated with the code block). An encoder may utilize MLC combined with polar coding and a 256QAM constellation, which may result in spectral efficiency (SPEF) gains as compared to utilizing polar coding with one or more other coding schemes (e.g., up to a 3 dB gain compared to utilizing polar coding with BICM).

In some systems, a device may use one or more techniques to further improve MLC with polar coding (e.g., beyond the SPEF gains). According to techniques described herein, a decoder may achieve a reduction in decoder complexity for an SCL decoder (or may adjust the complexity to a different component or process of the decoder to improve performance) based on utilizing multi-stage error checking for polar coding. In some cases, the decoder may request one or more locations in a polar-encoded code block for inclusion of one or more respective error check portions. In some cases, multi-stage error checking for polar-encoded code blocks may enable a decoder to reduce a complexity of the SCL decoder at one or more portions (e.g., stages, data portions) of the polar-encoded code block. For example, a decoder may reduce a list size of the SCL decoder, may change one or more soft decisions to hard decisions for decoding paths, may terminate a decoding process early, or any combination thereof after a first error check portion of the polar-encoded code block. In some cases, an SCL decoder may utilize a first list (e.g., of a first list size) to decode a first portion of the polar-encoded code block and may utilize a reduced list size or no list (e.g., a single decoding path) to decode at least a second portion of the polar-encoded code block based on the multi-stage error checking corresponding to the requested one or more locations.

According to techniques described herein, an encoder (e.g., a network entity 105) and a decoder (e.g., a UE 115) may communicate according to one or more techniques for multi-stage error checking in polar-encoded code blocks (e.g., associated with relatively lower complexity polar-encoded modulation). In some cases, the decoder may request at least one location for inclusion of at least one corresponding error check portion within multiple bit channels for polar code construction. In some cases, implementing the techniques described herein may reduce a complexity associated with an SCL decoder for the polar-encoded code block, may improve reliability and power consumption performance for polar-encoded code blocks associated with high order constellations, or both.

For some decoders, decoding polar-encoded code blocks via an SCL decoder may include operating the SCL decoder at a full complexity (e.g., a full or default list size) until the end of the polar-encoded code block, at which point the decoder may perform an error check on the decoding of the polar-encoded code block (e.g., on multiple probable bit sequences determined by the SCL decoder). However, using polar coding for some transmissions (e.g., PDSCH transmissions in addition to PDCCH transmissions, or other transmissions) with high order constellations may increase a complexity associated with decoding polar-encoded code blocks in a wireless communications system.

According to techniques described herein, adding an error check (e.g., based on an error check portion) within (e.g., in the middle) of the polar-encoded code block may reduce the decoder complexity (e.g., processing complexity, processing overhead, memory overhead) and power consumption at the decoder. As described herein, some examples of decoder complexity reduction may be based on the decoder reducing a list size associated with SCL decoding part way through the SCL decoding. Because calculating and tracking each decoding path uses processing and memory resources, reducing the list size (e.g., the quantity of decoding paths) for part of the SCL decoding process may correspondingly reduce the processing and memory overhead associated with the SCL decoding. Additionally, or alternatively, the decoder may reduce a quantity of bits per log-likelihood ratio (LLR) calculation after a first portion (e.g., based on making hard decisions on bits for the first portion) based on a first error check portion. Additionally, or alternatively, the techniques described herein may improve decoding performance at the decoder by increasing the list size for the bit channels of the polar-encoded code block that are before a first error check portion in the decoding order (e.g., reusing saved complexity). For example, rather than use a list size of 8 for an entire SCL decoding process, a decoder may use a list size of 16 for a first portion to improve the reliability of correctly decoding the first portion, may use a first error check portion to determine a decoding path from the 16 paths that passes the first error check, and may use a list size of 1 for a second portion (e.g., continuing from the decoding path that passed the first error check) to improve a complexity associated with decoding the second portion of the polar-encoded code block. In some cases, the decoder may use a second error check portion (e.g., at the end of the code block) to confirm correct decoding of the second portion, the full code block, or both.

In some cases, the techniques described herein may apply to polar-encoded code blocks associated with high constellation orders, as bit channels associated with such code blocks may have a relatively higher variety of reliability (e.g., bit protection values) than bit channels associated with QPSK modulation. In some cases, the high variety of bit channel reliability may support an encoder splitting the polar-encoded code block and including multiple error check portions based on one or more requested locations from the decoder for the multiple error check portions. For example, the decoder may request that the encoder add an error check portion to the end of the polar-encoded code block and that the encoder add another error check portion at a location within the polar-encoded code block based on bit channel reliability in the polar-encoded code block.

The requested location within the code block may be based on one or more decoding parameters associated with the decoder. For example, as described herein, the decoder may utilize an SCL decoder associated with a list of bit sequences (e.g., decoding paths), and the size of the list may determine a probability of the bits of the polar-encoded code block being decoded correctly at the decoder. Because the decoder may determine the list size, the decoder (e.g., a UE 115) may determine locations that are advantageous to the decoder for one or more error check portions and may signal the one or more locations to the encoder (e.g., a network entity 105). Additionally, or alternatively, the decoder may utilize a decoder other than an SCL decoder, in which case the encoder may determine the one or more locations based on power reductions at the decoder associated with possible locations and increased decoding performance at the decoder. Implementing the techniques described herein may reduce a complexity of the decoder linearly with the location of the error check portions in the polar-encoded code block (e.g., the sooner in the polar-encoded code block the error check portions are, the greater reduction in complexity is possible for the decoder), with diminishing increases in performance. Additionally, implementing the techniques described herein may improve the decoder performance by increasing the list size associated with decoding a portion of the polar-encoded code block prior to a requested location for error check bits.

In some wireless communications systems, a probability distribution function (PDF) of decoding a bit of a polar-encoded code block in error with an SCL decoder may be plotted for each bit index (e.g., bit channel index) of the polar-encoded code block. The plot may be based on a quantity of total bit channels in the polar-encoded code block (e.g., 1024 bit channels or some other quantity of bit channels, N), an amount of information bits per bit channel (e.g., 3 information bits per bit channel or some other quantity of information bits per channel use), or both. In some cases, a majority of incorrectly decoded bits are relatively more likely to occur in some initial bit channels of the polar-encoded code block before a threshold (e.g., the first 550 bit channels of the 1024 bit channel code block) based on the channel polarization. After, the threshold, the PDF may predict relatively low (e.g., approximately zero) chances of incorrectly decoding bits in bit channels of the polar-encoded code block.

The bit error distribution diagram 200 may plot an example PDF of incorrectly decoded bit channels 225 (e.g., bit errors) for each bit index of the polar-encoded code block 205 implementing the techniques described herein. In some cases, the polar-encoded code block 205 may include one or more data bit channels 210 (e.g., including bit channels allocated for frozen bits and bit channels allocated for information bits) and one or more error check portions 215 (e.g., an error check portion 215-a and an error check portion 215-b). In some aspects, the polar-encoded code block 205 may include a first data portion 235, a second data portion 240, and a third data portion 245. The first data portion may be before the error check portion 215-a (e.g., according to a decoding order of a decoder), and the error check portion 215-a may be located at a requested location 230, which a decoder may request for the inclusion of the error check portion 215-a in the polar-encoded code block 205. The data portion 240 and the data portion 245 may be located after the error check portion 215-a and before the error check portion 215-b (e.g., according to the decoding order). In some cases, the threshold for high probability of bit errors may be located at the end of the second data portion 240 and the beginning of the third data portion 245.

In some cases, the requested location 230 may be located at any location within the polar-encoded code block 205, and an encoder of the polar-encoded code block 205 may include the error check portion 215-a at the requested location 230. For example, the requested location 230 may be after the bit channels of one eighth of the polar-encoded code block 205, after the bit channels of one fourth of the polar-encoded code block 205, after the bit channels of one half of the polar-encoded code block 205, at the end of the polar-encoded code block 205, or at any other location within the polar-encoded code block 205. In some cases, the error check portion 215-*b* may be located at the end of the polar-encoded code block 205 in place of or in addition to the error check portion 215-*a*. Although two error check portions 215 are included in the bit error distribution diagram 200, the techniques described herein may apply to any quantity of error check portions 215 and corresponding requested locations 230.

In some cases, after the error check portion 215-*a*, the decoder receiving the polar-encoded code block 205 may reduce a list size of an associated SCL decoder (e.g., from 32 to 1). The bit error distribution diagram 200 may illustrate a decrease in an error probability of one or more bit channels of the polar-encoded code block 205 based on the requested location 230 for the error check portion 215-*a*. For example, the bit channels in the first data portion 235 may be associated with relatively low (e.g., close to zero, zero) error probability based on using a relatively large list size (e.g., 32) and the error check portion 215-*a* at the requested location 230. However, the bit channels in the second data portion 240 (e.g., after the requested location 230 and before the threshold) may be associated with relatively higher error probabilities based on the reduced list size (e.g., 1). The decode may identify such errors at the error check portion 215-*b* at the end of the polar-encoded code block. The bit channels in the third data portion 245 may be associated with relatively lower error probabilities based on the polarization of the channels, with these bit channels corresponding to relatively reliable bit channels.

In some cases, due to the decoder reducing the list size associated with the SCL decoder after the requested location 230, the earlier the requested location 230 is in the polar-encoded code block 205 (e.g., the less bit channels that are in the first data portion 235 preceding the first error check portion 215-*a*), the greater SCL complexity reduction the decoder may achieve. For example, if the requested location 230 is halfway through the polar-encoded code block 205 (e.g., after bit channels of the first half of the polar-encoded code block 205), the decoder may achieve a complexity reduction near a factor of 2, due to reducing the size of the list of the SCL decoder after half of the polar-encoded code block 205. If the requested location 230 is earlier in the polar-encoded code block 205, the decoder may achieve greater complexity reductions. However, the decoding reliability may decrease based on moving the first error check portion 215-*a* (and, correspondingly, the reduction in list size) earlier in the polar-encoded code block 205. Accordingly, the decoder (e.g., a UE 115) may select a requested location 230 for the first error check portion 215-*a* based on a tradeoff between decoding complexity and reliability. In some cases, the decoder may select a relatively earlier requested location 230 (e.g., corresponding to greater decoding complexity savings) for relatively low priority messages, for channels with relatively high reliability (e.g., a reference signal receive power (RSRP) or other channel metric satisfying a threshold), or both. The decoder may select a relatively later requested location 230 (e.g., corresponding to greater decoding reliability) for relatively high priority messages, for channels with relatively low reliability, based on a quantity of message failures, or some combination thereof.

Figure 3:
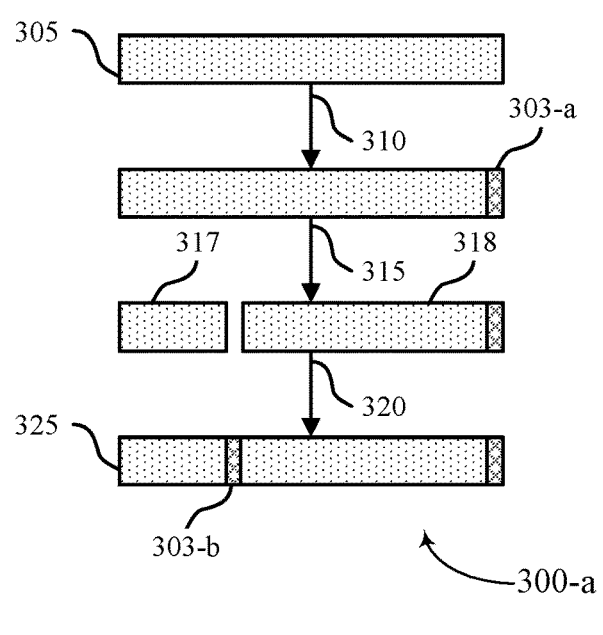
FIG. 3 shows examples of polar code construction processes that support multi-stage error checking for polar-encoded code blocks in accordance with one or more aspects of the present disclosure.
Figure 3:
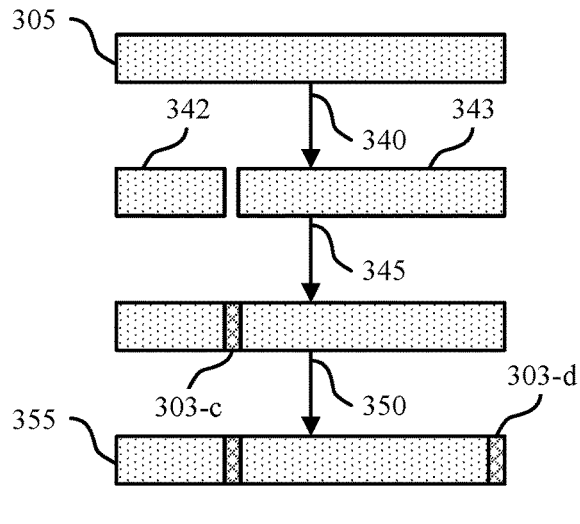
Figure 3:
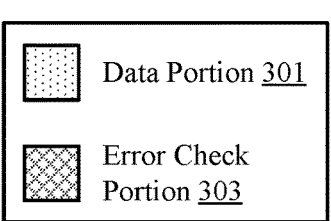
Figure 3:
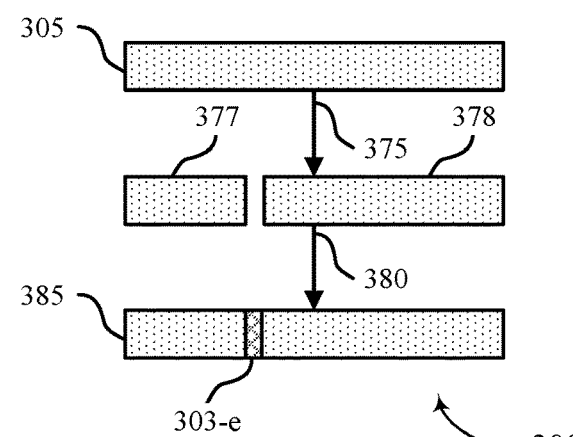

FIG. 3 shows examples of polar code construction processes (e.g., a polar code construction process 300-*a*, a polar code construction process 300-*b*, and a polar code construction process 300-*c*) that support multi-stage error checking for polar-encoded code blocks in accordance with one or more aspects of the present disclosure. In some cases, aspects of the polar code construction processes may implement or be implemented by aspects of a wireless communications system 100 as described with reference to FIG. 1. The polar code construction processes may include a polar-encoded code block 305 and error check portions 303, which may be examples of the polar-encoded code block 205 and the error check portions as described herein with respect to FIG. 2. In some cases, an encoder (e.g., an encoding device, a transmitter, a transceiver, a UE 115, a network entity 105) may construct a polar-encoded code block 305 which has multi-stage error checking according to one or more of the polar code construction processes. The "actions" described with reference to the polar code construction processes may be combined in any order or combination irrespective of the order shown herein, and the examples set forth herein are not limiting. For example, a device may perform the "actions" as a single process or multiple processes during code block construction, or the "actions" may represent an end result of code block generation. Additionally, although each polar code construction process includes a quantity of error check portions 303, the techniques described herein may apply to any quantity of error check portions 303 in any location of the polar-encoded code block 305.

The polar code construction process 300-*a* represents a first example method for an encoder to construct a finalized polar-encoded code block from a polar-encoded code block 305 according to techniques described herein. As a first action 310, an encoder (e.g., a network entity 105, a UE 115) may add an error check portion 303-*a* to the end of the polar-encoded code block 305 (e.g., a full code block error check portion). Thus, the error check portion 303-*a* may be associated with each information bit channel of the polar-encoded code block 305. For example, the error check portion 303-*a* may confirm correct decoding of the entire polar-encoded code block 305.

As a second action 315, the encoder may split the polar-encoded code block 305 into 2 portions (e.g., 2 "imaginary blocks," for illustrative purposes) at a specific location (e.g., a requested location 230 by a decoder, as described with respect to FIG. 2, or some other location based on the requested location 230). For example, the encoder may split the polar-encoded code block into two data portions 301, a first data portion 317 and a second data portion 318. As described herein, the requested location may be at any location in the polar-encoded code block 305 (e.g., based on the bit error probability of the bit channels of the polar-encoded code block 305, based on one or more decoding parameters of the decoder, or based on any other information).

As a third action 320, the encoder may add an error check portion 303-*b* (e.g., an additional error check portion) at the end of the first data portion 317 and may append the second data portion 318 to the first data portion 317 after the error check portion 303-*b*. In some cases, the error check portion 303-*b* may be associated with the first data portion 317 (e.g., or any data portion before it, or the data portion directly before it, in the case of multiple additional error check portions). For example, the error check portion 303-*b* may confirm correct decoding of the first data portion 317.

In the polar code construction process 300-*a*, a finalized polar-encoded code block 325 may have a dedicated error check portion (e.g., error check portion 303-*b*) for the first data portion 317, and an additional error check portion (e.g., error check portion 303-*a*) for both the first data portion 317 and the second data portion 318. However, the error check portion 303-*a* may not be associated with (e.g., may not provide protection for) the error check portion 303-*a*, such that the error check portion 303-*a* may assist the decoder in checking the information bit channels of the polar-encoded code block 305, but not the bit channels associated with the error check portion 303-*b*. The encoder may transmit the finalized polar-encoded code block 325 to a decoder for decoding.

The polar code construction process 300-*b* represents a second example method for an encoder to construct a finalized polar-encoded code block from a polar-encoded code block 305 according to techniques described herein. As a first action 340, the encoder (e.g., a network entity 105, a UE 115) may split the polar-encoded code block 305 into 2 data portions 301 at a location (e.g., the requested location 230 as described with respect to FIG. 2). For example, the encoder may split the polar-encoded code block into a first data portion 342 and a second data portion 343. As described herein, the requested location may be at any location in the polar-encoded code block 305.

As a second action 345, the encoder may add an error check portion 303-*c* (e.g., an additional error check portion) at the end of the first data portion 342 and may append the second data portion 343 to the first data portion 342 after the error check portion 303-*c*. In some cases, the error check portion 303-*c* may be associated with the first data portion 342 (e.g., or any data portion before it, or the data portion directly before it, in the case of multiple additional error check portions).

As a third action 350, the encoder may add an error check portion 303-*d* to the end of the polar-encoded code block 305. In some cases, the error check portion 303-*d* may be associated with the first data portion 342, the second data portion 343, and the error check portion 303-*c*. In some other cases, the error check portion 303-*d* may be associated with the second data portion 343.

Thus, in the polar code construction process 300-*b*, a finalized polar-encoded code block 355 may have a dedicated error check portion (e.g., error check portion 303-*c*) for the first data portion 342. In some cases, the finalized polar-encoded code block 355 may have an additional error check portion (e.g., error check portion 303-*d*) for the first data portion 342, the second data portion 343, and the error check portion 303-*c*. Alternatively, the finalized polar-encoded code block 355 may have the additional error check portion 303-*d* for the second data portion 343 (e.g., but not for the first data portion 342 and the first error check portion 303-*c*). The encoder may transmit the finalized polar-encoded code block 355 to the decoder.

The polar code construction process 300-*c* represents a third example method for an encoder to construct a finalized polar-encoded code block from a polar-encoded code block 305 according to techniques described herein. As a first action 375, the encoder (e.g., a network entity 105, a UE 115) may split the polar-encoded code block 305 into 2 data portions 301 at a location (e.g., the requested location 230 as described with respect to FIG. 2). For example, the encoder may split the polar-encoded code block into a first data portion 377 and a second data portion 378. As described herein, the requested location may be at any location in the polar-encoded code block 305.

As a second action 380, the encoder may add an error check portion 303-*e* (e.g., an additional error check portion) at the end of the first data portion 377 and may append the second data portion 378 to the first data portion 377 after the error check portion 303-*e*. In some cases, the error check portion 303-*e* may be associated with the first data portion 377 (e.g., or any data portion before it, or the data portion directly before it, in the case of multiple additionally error check portions).

Thus, in the polar code construction process 300-*c*, a finalized polar-encoded code block 385 may have a dedicated error check portion (e.g., error check portion 303-*e*) for the first data portion 377, but no dedicated error check portion for the second data portion 378. In some cases, the lack of a dedicated error check portion for the second data portion 378 may reduce a signaling overhead of the finalized polar-encoded code block 385 (e.g., compared to the finalized polar-encoded code block 325 and the finalized polar-encoded code block 355). In some cases, the finalized polar-encoded code block 385 may use an error check portion associated with a transfer block that includes the finalized polar-encoded code block 385 for error checking the second data portion 378, the error check portion 303-*e*, or both. The encoder may transmit the finalized polar-encoded code block 385 to the decoder.

In some cases, the techniques described herein may be applicable to one or more wireless communication channels, such as PDCCH and PDSCH. Additionally, or alternatively, a network entity 105 may configure a UE 115 (e.g., for either PUSCH or for PUCCH) to perform multi-stage error checking for polar-encoded code blocks (e.g., as described herein). For example, the network entity 105 may configure the UE 115 with a quantity of bits for each error check portion in a polar-encoded code block 305, as well as the locations for the error check portions.

Additionally, or alternatively, the techniques described herein may apply to polar encoding combined with MLC, BICM, or both. In some cases, a power consumption reduction at the decoder (e.g., the UE 115, the network entity 105) may be relatively greater when the polar coding is combined with MLC that when the polar coding is combined with BICM, due to, for example, a stronger polarization phenomenon associated with MLC (e.g., which may increase a Euclidian distance between constellation points of the polar-encoded code block 305).

Figure 4:
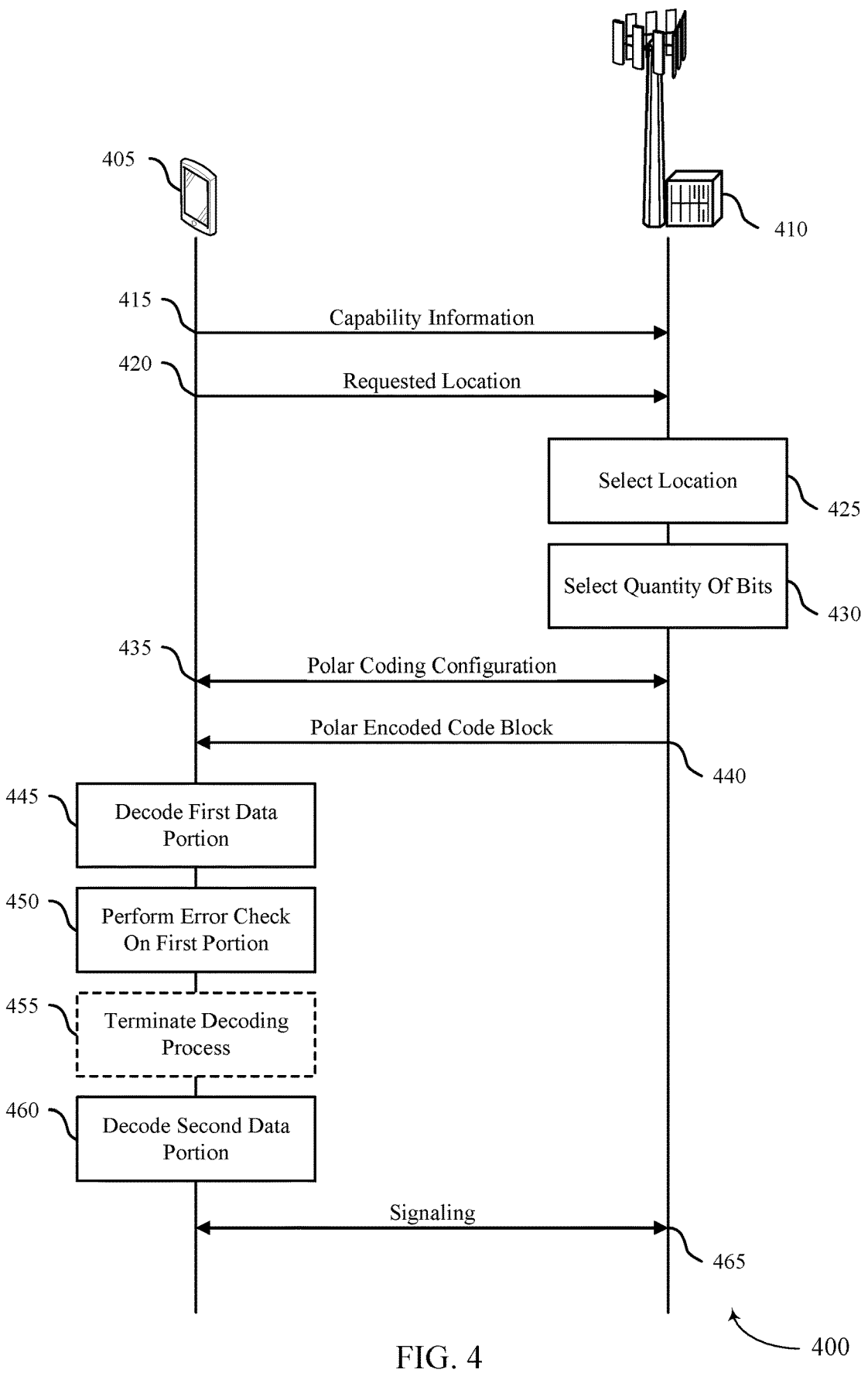
FIG. 4 shows an example of a process flow that supports multi-stage error checking for polar-encoded code blocks in accordance with one or more aspects of the present disclosure.

FIG. 4 shows an example of a process flow 400 that supports multi-stage error checking for polar-encoded code blocks in accordance with one or more aspects of the present disclosure. In some cases, aspects of the process flow 400 may implement or be implemented by aspects of FIGS. 1-3. For example, the process flow 400 may include a decoder 405 (e.g., a decoding device) and an encoder 410 (e.g., an encoding device), which may be examples of UEs 115, network entities 105, transmitting devices, receiving devices, or any combination thereof, as described herein with respect to FIGS. 1-3. In some cases, the decoder 405 and the encoder 410 may communicate polar-encoded code blocks with multi-stage error checking according to the process flow 400.

In the following description of process flow 400, the operations may be performed in a different order than the order shown, or other operations may be added or removed from the process flow 400. For example, some operations may also be left out of process flow 400, may be performed in different orders or at different times, or other operations may be added to process flow 400. Although the decoder 405 and the encoder 410 are shown performing the operations of process flow 400, some aspects of some operations may also be performed by one or more other wireless devices or network devices.

At 415, the decoder 405 (e.g., a UE 115) may transmit, to the encoder 410 (e.g., a network entity 105), signaling indicating a capability of the decoder 405 to decode one or more polar-encoded code blocks that have multiple error check portions. In some cases, the signaling may indicate that the decoder 405 uses a successive cancellation decoder with a single decoding path (e.g., does not support SCL decoding). In some cases, the decoder 405 may transmit the indication of the capability during or after a connection establishment with the encoder 410.

At 420, the decoder 405 may transmit signaling indicating at least one requested location for inclusion of at least one error check portion within multiple bit channels for polar code construction. In some cases, an error check portion may include one or more CRC bits. In some cases, the signaling may indicate multiple (e.g., a set of) candidate locations for inclusion of the at least one error check portion. In some examples, the signaling may additionally indicate corresponding reductions in power consumption associated with the candidate locations for the decoding process at the decoder 405. In some cases, the encoder 410 (e.g., a network entity 105) may use the corresponding reductions in power in a power efficiency comparison (e.g., power efficiency versus performance loss). In some aspects, the signaling at 420 may be the same or different signaling as that of 415.

In some cases, the decoder 405 may transmit the signaling indicating the at least one requested location to update a configured location of a first error check portion. For example, the decoder 405 may receive other signaling (e.g., previous to 420) configuring a location for the first error check portion within the multiple bit channels for the polar code construction (e.g., similar to what is described herein at 435, but not shown). In such examples, the decoder 405 may transmit the signaling at 420 to request an update to the configured location.

In some cases, the requested location may be based on one or more decoding parameters associated with the decoder 405 (e.g., of a UE 115). For example, the one or more decoding parameters may include a list size for SCL decoding, a code rate for communications, a rank for communications, or any combination thereof. In some cases, the signaling at 420 may indicate the requested location using a lookup table index, a bit channel index, a proportion of the multiple bit channels, or any combination thereof. For example, the lookup table may include one or more preconfigured locations for the one or more error check portions (e.g., one or more percentages of the polar-encoded code block to occur before the error check portions) and corresponding list sizes for SCL decoding, code rates for communication, ranks for communication, or any combination thereof.

The signaling may also include a request for inclusion of a second error check portion (e.g., as described herein with respect to FIGS. 2 and 3) for the polar code construction. For example, the second error check portion may verify successful decoding of a first data portion before the first error check portion, a second data portion, the first error check portion, or any combination thereof of a polar-encoded code block with multi-stage error checking (e.g., as described herein with respect to FIGS. 2 and 3). In some cases, the decoder 405 may transmit an indication for the second error check portion to verify the first data portion, the second data portion, the first error check portion, or any combination thereof.

Additionally, or alternatively, the signaling may include an indication of a first quantity of bits for the error check portion, a second quantity of bits for the second error check portion, a total quantity of bits for multiple error check portions, or any combination thereof. In some cases, the first quantity of bits, the second quantity of bits, the total quantity of bits, or any combination thereof, may be based on the list size for SCL decoding at the decoder 405. Additionally, or alternatively, the first quantity of bits, the second quantity of bits, the total quantity of bits, or any combination thereof, may be predefined at the decoder 405 or configured at the decoder 405 (e.g., by the encoder 410, by a network entity 105).

In some cases, the signaling may also indicate one or more requested (e.g., preferred) techniques for implementing multi-stage error checking for polar-encoded code blocks (e.g., as described herein with respect to FIG. 3). Additionally, or alternatively, the signaling may indicate a requested size (e.g., minimal size, threshold quantity of bits) of the error check portion. In some cases, the decoder 405 may determine the requested size of the error check portion based on the list size for SCL decoding. For example, if the list size for SCL decoding is 32, the decoder 405 may determine the requested size (e.g., threshold size) of the error check portion to be $\log_2(32)$ bits, or 5 bits.

At 425, the encoder 410 may select locations for the one or more error check portions within the multiple bit channels for the polar code construction based on the requested location signaling. In some cases, the encoder 410 may select the location based on receiving the indication of multiple candidate locations, the corresponding reductions in power consumption, or both. In some examples, the decoder 405 may indicate a single requested location for an error check portion, and the encoder 410 may use the requested location or may select a different location (e.g., based on the requested location and other information or parameters at the encoder 410). Additionally, or alternatively, the encoder 410 may select the location for an error check portion for the decoder 405 (e.g., or another decoder) based on the decoder 405 using the successive cancellation decoder with the single decoding path. In some examples, the encoder 410 may select to use a single error check portion (e.g., at the end of the code block) if the decoder 405 supports a single decoding path. The encoder 410 may support any quantity of error check portions in the polar-encoded code block (e.g., a polar-encoded signal or message).

At 430, the encoder 410 may select a first quantity of bits for the error check portion, a second quantity of bits for the second error check portion, or both. In some cases, the encoder 410 may determine if a total quantity of bits for the error check portions in a polar-encoded code block remains constant or changes dynamically according to at least the first quantity of bits. For example, the total quantity of bits for the error check portion and the second error check portion may be constant. As an illustrative example, the total quantity of bits may be 24 bits, such that, if the error check portion has 6, 8, or 10 bits, a second error check portion may have 18, 16, or 14 bits, respectively. As another example, the second error check portion may have a constant quantity of bits (e.g., 20), and the encoder 410 may configure the first error check portion to have a dynamic quantity of bits including 6, 8, or 10, such that a total quantity of error checking bits may be equal to 26, 28, or 30 bits accordingly. The decoder 405 and encoder 410 may coordinate the quantities of error checking bits to ensure the decoder 405 may successfully decode the polar-encoded code block using the error checking bits.

At 435, the decoder 405 may receive, from the encoder 410, one or more configurations for polar-encoded code blocks. For example, the decoder 405 may receive signaling that configures at least one location for (e.g., corresponding to each of) the at least one error check portions within the multiple bit channels for the polar code construction based on the requested at least one location. In some cases, the encoder 410 may transmit the signaling configuring the at least one location based on selecting the one or more locations.

In some cases, the decoder 405 may determine one or more improved locations for error check portions based on the configured at least one location and may indicate the one or more improved locations to the encoder 410. For example, the decoder 405 may perform a full complexity polar decoding on a received polar-encoded code block based on the configured at least one location and may determine if one or more other locations may provide an increased communication performance gap, reduced power usage at the decoder 405, decreased complexity of the SCL decoding, or any combination thereof.

Additionally, or alternatively, after the decoder 405 is in a connected mode with the encoder 410 (e.g., RRC_CON-NECTED mode), the encoder 410 may transmit an indication of one or more techniques for the decoder 405 to use for communicating polar-encoded code blocks with multi-stage error correction (e.g., as described herein with respect to FIG. 3), an indication of a channel (e.g., wireless communication resources) for the communications, or both. In some cases, the decoder 405 may select techniques that reduce an error checking overhead and power consumption at the decoder 405, while increasing a transmit power associated with the channel.

In some cases, the indication of the one or more techniques may be transmitted via MAC control element (CE) signaling, RRC configuration signaling, downlink control information (DCI) signaling, or any combination thereof. The encoder 410 may also transmit the signaling in a periodic or an aperiodic manner.

At 440, the encoder 410 may transmit, and the decoder 405 may receive, a polar-encoded code block including at least a first data portion, the first error check portion, and a second data portion. In some cases, the first error check portion may follow (e.g., be located temporally after) the first data portion and may precede (e.g., be located tempo-rally before) the second data portion, in accordance with a decoding order for the polar-encoded code block, a bit channel index order, or both. The order of at least the first data portion, the first error check portion, and the second data portion may be based on the requested location for inclusion of the error check portion, the configured location for the error check portion, or both. Additionally, or alter-natively, the polar-encoded code block may be based on the first quantity of bits, the second quantity of bits, the total quantity of bits, or any combination thereof for the error check portions.

In some cases, the polar-encoded code block may also include the second error check portion following the second data portion, in accordance with the decoding order for the polar-encoded code block. For example, the polar-encoded code block may include the second error check portion based on receiving the request from the decoder 405 at 420 for the second error check portion.

The decoder 405 may perform a polar decoding process on the received code block. In some cases, the decoding process may be based on multiple error check portions included in the polar-encoded code block, including the first error check portion, the second error check portion, or both.

At 445, the decoder 405 may decode the first data portion according to multiple decoding paths corresponding to a first list size for SCL decoding. The first data portion may include frozen bits, information bits, or a combination thereof.

At 450, the decoder 405 may perform an error check for the first data portion using the first error check portion. For example, the decoder 405 may determine if the multiple decoding paths pass or fail the error check for the first data portion based on a comparison between the multiple paths and the bits of the first error check portion. For example, the decoder 405 may perform a CRC for the set of decoding paths and may determine if any path of the decoding paths passes the CRC for the first data portion.

In some cases, the decoder 405 may reduce a complexity of the SCL decoding, reduce power consumption at the decoder 405, or both based on the first error check portion. For example, the decoder 405 may reduce the list size associated with SCL decoding at the decoder 405 based on a decoding path passing the error check. The decoder 405 may reduce the list size to include the one or more decoding paths that passed the first error check and may continue decoding using the one or more decoding paths. For example, if the decoder 405 reduces the list size to 1 (e.g., corresponding to successive cancellation decoding, with a list), the decoder 405 may track a single decoding path starting from a decoding path that passes the first error check. Additionally, or alternatively, the decoder 405 may reducing a quantity of bits associated with one or more LLR calculations for the decoding process (e.g., the SCL decod-ing) based on the error check for the first data portion.

In some examples, at 455, the decoder 405 may terminate the decoding process for the polar-encoded code block based on the multiple decoding paths failing the error check for the first data portion. For example, the decoder 405 may deter-mine that each decoding path fails the error check and may terminate the decoding to reduce latency and power con-sumption in the decoder 405.

In some other examples, at 460, the decoder 405 may decode the second data portion according to one or more decoding paths corresponding to a second list size different from the first list size for the SCL decoding based on the error check for the first data portion. In some cases, the decoder 405 may decode the second data portion based on the selected decoding path for the first data portion, such that the one or more decoding paths corresponding to the second list size include one or more of the multiple paths associated with decoding the first data portion. For example, the decoder 405 may select, from the multiple decoding paths, a decoding path for the first data portion based on the error check for the first data portion. The decoder 405 may decode the second data portion based on the selected decoding path. Additionally, or alternatively, the decoder 405 may make hard decisions on bits for the first portion of the decoding process based on the first error check (e.g., based on a decoding path passing the first error check), and may track soft decisions on bits for the second portion.

In some cases, the decoding process may be further based on the second error check portion. For example, (e.g., similar to 450) the decoder 405 may perform an error check on the second data portion, the first data portion, the first error check portion, or any combination thereof based on the second error check portion (e.g., as described herein with respect to FIG. 3).

At 465, the decoder 405 and the encoder 410 may communicate additional signaling based on the decoding process for the polar-encoded code block, where the decod-ing process is based on the first error check portion (e.g., as described herein). For example, the encoder 410 may trans-mit one or more additional polar-encoded code blocks configured with error check portions at the configured locations, similar to the polar-encoded code block. The decoder 405 may reduce errors associated with decoding polar-encoded code blocks, reduce complexity associated with SCL decoding, decrease power consumption at the decoder 405, or any combination thereof.

Figure 5:
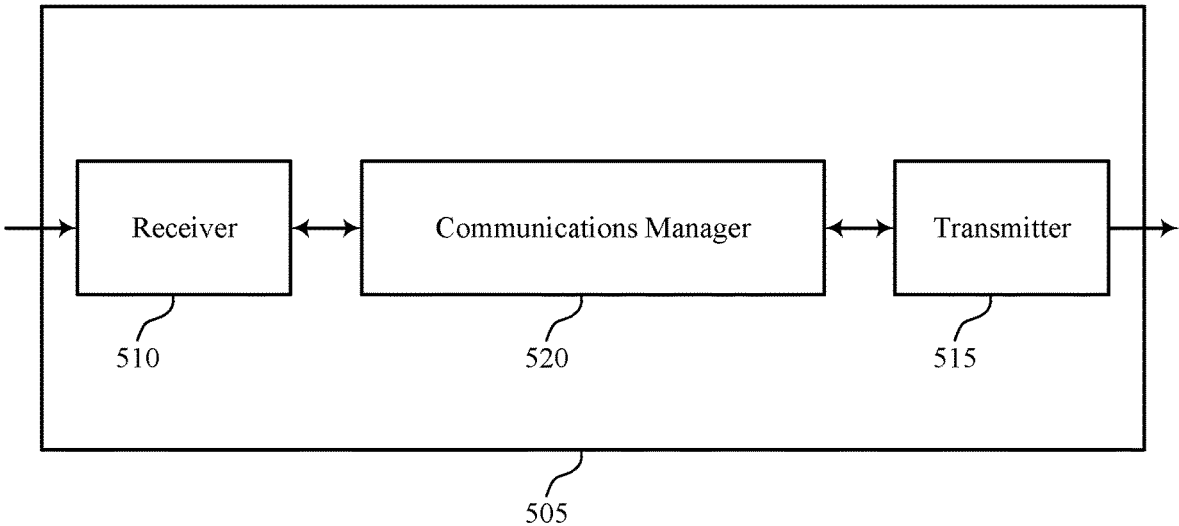
FIGS. 5 and 6 show block diagrams of devices that support multi-stage error checking for polar-encoded code blocks in accordance with one or more aspects of the present disclosure.

FIG. 5 shows a block diagram 500 of a device 505 that supports multi-stage error checking for polar-encoded code blocks in accordance with one or more aspects of the present disclosure. The device 505 may be an example of aspects of a UE 115 as described herein. The device 505 may include a receiver 510, a transmitter 515, and a communications manager 520. The device 505, or one or more components of the device 505 (e.g., the receiver 510, the transmitter 515, and the communications manager 520), may include at least one processor, which may be coupled with at least one memory, to, individually or collectively, support or enable the described techniques. Each of these components may be in communication with one another (e.g., via one or more buses).

The receiver 510 may provide a means for receiving information such as packets, user data, control information, or any combination thereof associated with various information channels (e.g., control channels, data channels, information channels related to multi-stage error checking for polar-encoded code blocks). Information may be passed on to other components of the device 505. The receiver 510 may utilize a single antenna or a set of multiple antennas.

The transmitter 515 may provide a means for transmitting signals generated by other components of the device 505. For example, the transmitter 515 may transmit information such as packets, user data, control information, or any combination thereof associated with various information channels (e.g., control channels, data channels, information channels related to multi-stage error checking for polar-encoded code blocks). In some examples, the transmitter 515 may be co-located with a receiver 510 in a transceiver module. The transmitter 515 may utilize a single antenna or a set of multiple antennas.

The communications manager 520, the receiver 510, the transmitter 515, or various combinations thereof or various components thereof may be examples of means for performing various aspects of multi-stage error checking for polar-encoded code blocks as described herein. For example, the communications manager 520, the receiver 510, the transmitter 515, or various combinations or components thereof may be capable of performing one or more of the functions described herein.

In some examples, the communications manager 520, the receiver 510, the transmitter 515, or various combinations or components thereof may be implemented in hardware (e.g., in communications management circuitry). The hardware may include at least one of a processor, a digital signal processor (DSP), a central processing unit (CPU), a graphics processing unit (GPU), a neural processing unit (NPU), an application-specific integrated circuit (ASIC), a field-programmable gate array (FPGA) or other programmable logic device, a microcontroller, discrete gate or transistor logic, discrete hardware components, or any combination thereof configured as or otherwise supporting, individually or collectively, a means for performing the functions described in the present disclosure. In some examples, at least one processor and at least one memory coupled with the at least one processor may be configured to perform one or more of the functions described herein (e.g., by one or more processors, individually or collectively, executing instructions stored in the at least one memory).

Additionally, or alternatively, the communications manager 520, the receiver 510, the transmitter 515, or various combinations or components thereof may be implemented in code (e.g., as communications management software) executed by at least one processor. If implemented in code executed by at least one processor, the functions of the communications manager 520, the receiver 510, the transmitter 515, or various combinations or components thereof may be performed by a general-purpose processor, a DSP, a CPU, a GPU, an NPU, an ASIC, an FPGA, a microcontroller, or any combination of these or other programmable logic devices (e.g., configured as or otherwise supporting, individually or collectively, a means for performing the functions described in the present disclosure).

In some examples, the communications manager 520 may be configured to perform various operations (e.g., receiving, obtaining, monitoring, outputting, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to obtain information, output information, or perform various other operations as described herein.

The communications manager 520 may support wireless communication in accordance with examples as disclosed herein. For example, the communications manager 520 is capable of, configured to, or operable to support a means for transmitting first signaling indicating a requested location for inclusion of an error check portion within a set of multiple bit channels for polar code construction, the requested location based on one or more decoding parameters of the UE. The communications manager 520 is capable of, configured to, or operable to support a means for receiving a polar-encoded code block including a first data portion, a first error check portion, and a second data portion, the first error check portion following the first data portion and preceding the second data portion in accordance with a decoding order for the polar-encoded code block based on the requested location for inclusion of the error check portion. The communications manager 520 is capable of, configured to, or operable to support a means for communicating second signaling based on a decoding process for the polar-encoded code block, the decoding process based on the first error check portion.

By including or configuring the communications manager 520 in accordance with examples as described herein, the device 505 (e.g., at least one processor controlling or otherwise coupled with the receiver 510, the transmitter 515, the communications manager 520, or a combination thereof) may support techniques for reduced power consumption and reducing complexity of the device 505. For example, a device 505 (e.g., a UE 115) implementing the techniques described herein may perform SCL decoding for part of a polar-encoded message using a list of a relatively smaller size, reducing power consumption and complexity of the device 505.

Figure 6:
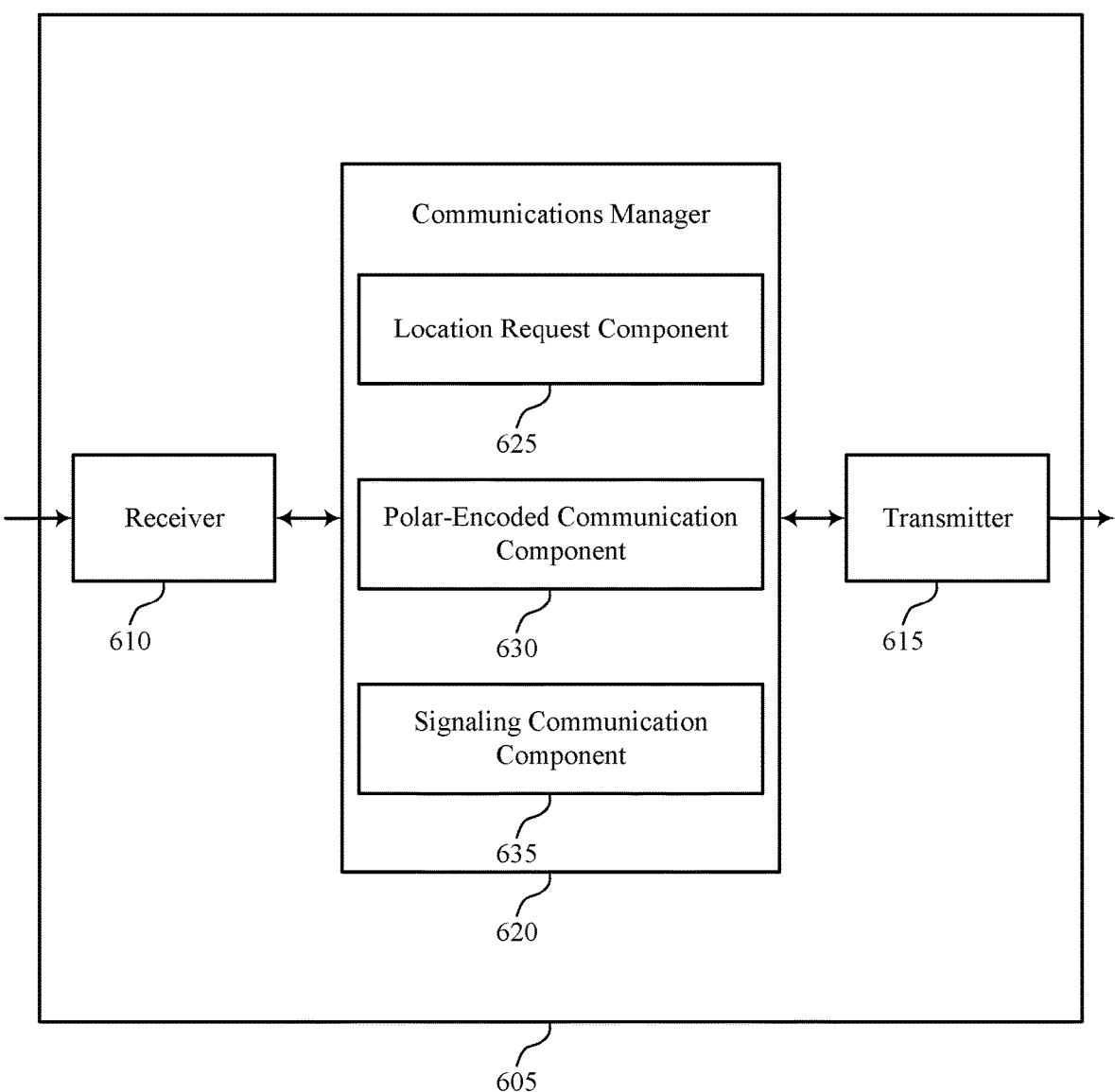

FIG. 6 shows a block diagram 600 of a device 605 that supports multi-stage error checking for polar-encoded code blocks in accordance with one or more aspects of the present disclosure. The device 605 may be an example of aspects of a device 505 or a UE 115 as described herein. The device 605 may include a receiver 610, a transmitter 615, and a communications manager 620. The device 605, or one or more components of the device 605 (e.g., the receiver 610, the transmitter 615, and the communications manager 620), may include at least one processor, which may be coupled with at least one memory, to support the described techniques. Each of these components may be in communication with one another (e.g., via one or more buses).

The receiver 610 may provide a means for receiving information such as packets, user data, control information, or any combination thereof associated with various information channels (e.g., control channels, data channels, information channels related to multi-stage error checking for polar-encoded code blocks). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to multi-stage error checking for polar-encoded code blocks). In some examples, the transmitter 615 may be co-located with a receiver 610 in a transceiver module. The transmitter 615 may utilize a single antenna or a set of multiple antennas.

The device 605, or various components thereof, may be an example of means for performing various aspects of multi-stage error checking for polar-encoded code blocks as described herein. For example, the communications manager 620 may include a location request component 625, a polar-encoded communication component 630, a signaling communication component 635, or any combination thereof. The communications manager 620 may be an example of aspects of a communications manager 520 as described herein. In some examples, the communications manager 620, or various components thereof, may be configured to perform various operations (e.g., receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communication in accordance with examples as disclosed herein. The location request component 625 is capable of, configured to, or operable to support a means for transmitting first signaling indicating a requested location for inclusion of an error check portion within a set of multiple bit channels for polar code construction, the requested location based on one or more decoding parameters of the UE. The polar-encoded communication component 630 is capable of, configured to, or operable to support a means for receiving a polar-encoded code block including a first data portion, a first error check portion, and a second data portion, the first error check portion following the first data portion and preceding the second data portion in accordance with a decoding order for the polar-encoded code block based on the requested location for inclusion of the error check portion. The signaling communication component 635 is capable of, configured to, or operable to support a means for communicating second signaling based on a decoding process for the polar-encoded code block, the decoding process based on the first error check portion.

Figure 7:
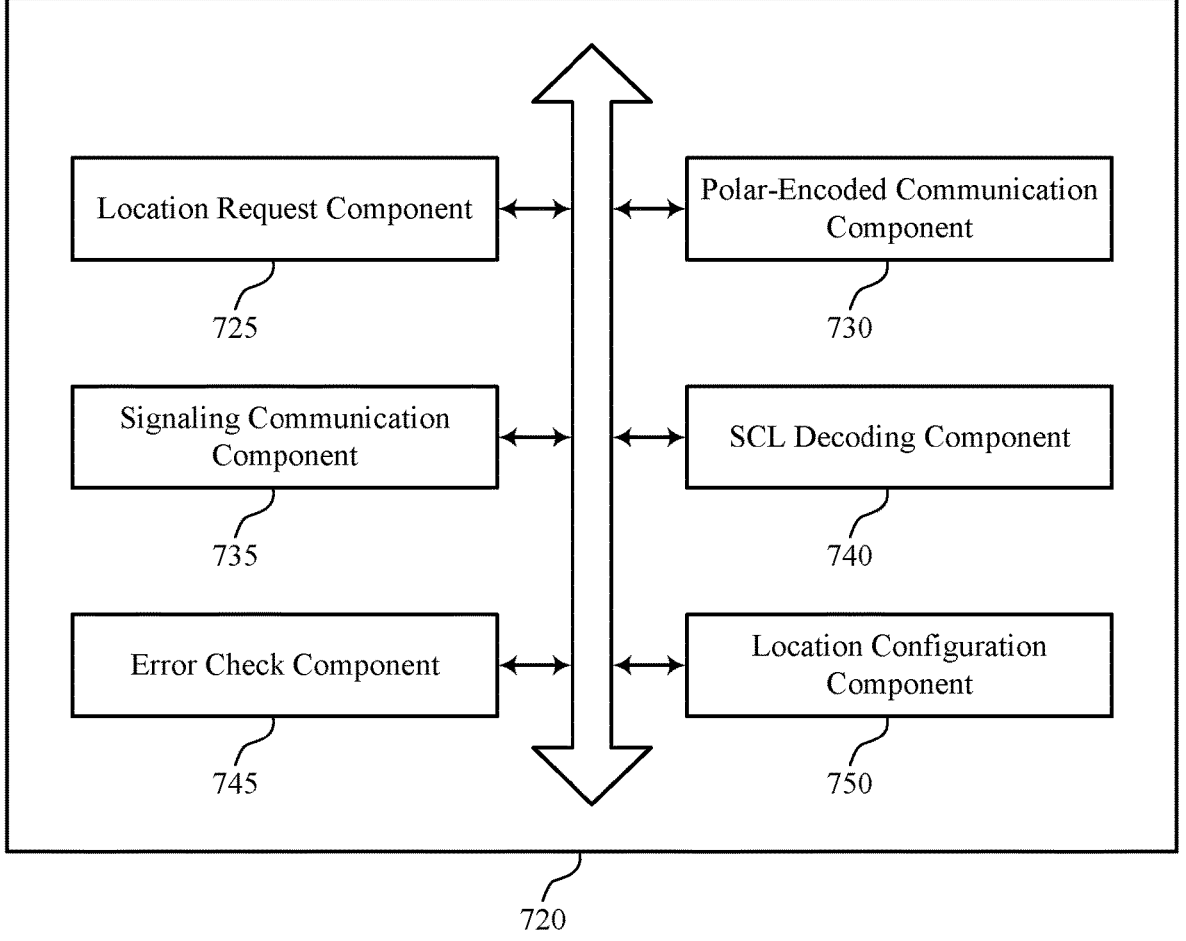
FIG. 7 shows a block diagram of a communications manager that supports multi-stage error checking for polar-encoded code blocks in accordance with one or more aspects of the present disclosure.

FIG. 7 shows a block diagram 700 of a communications manager 720 that supports multi-stage error checking for polar-encoded code blocks in accordance with one or more aspects of the present disclosure. The communications manager 720 may be an example of aspects of a communications manager 520, a communications manager 620, or both, as described herein. The communications manager 720, or various components thereof, may be an example of means for performing various aspects of multi-stage error checking for polar-encoded code blocks as described herein. For example, the communications manager 720 may include a location request component 725, a polar-encoded communication component 730, a signaling communication component 735, an SCL decoding component 740, an error check component 745, a location configuration component 750, or any combination thereof. Each of these components, or components or subcomponents thereof (e.g., one or more processors, one or more memories), may communicate, directly or indirectly, with one another (e.g., via one or more buses).

The communications manager 720 may support wireless communication in accordance with examples as disclosed herein. The location request component 725 is capable of, configured to, or operable to support a means for transmitting first signaling indicating a requested location for inclusion of an error check portion within a set of multiple bit channels for polar code construction, the requested location based on one or more decoding parameters of the UE. The polar-encoded communication component 730 is capable of, configured to, or operable to support a means for receiving a polar-encoded code block including a first data portion, a first error check portion, and a second data portion, the first error check portion following the first data portion and preceding the second data portion in accordance with a decoding order for the polar-encoded code block based on the requested location for inclusion of the error check portion. The signaling communication component 735 is capable of, configured to, or operable to support a means for communicating second signaling based on a decoding process for the polar-encoded code block, the decoding process based on the first error check portion.

In some examples, the SCL decoding component 740 is capable of, configured to, or operable to support a means for decoding the first data portion according to a set of multiple decoding paths corresponding to a first list size for successive cancellation list decoding. In some examples, the error check component 745 is capable of, configured to, or operable to support a means for performing an error check for the first data portion using the first error check portion.

In some examples, the SCL decoding component 740 is capable of, configured to, or operable to support a means for decoding the second data portion according to one or more decoding paths corresponding to a second list size different from the first list size for the successive cancellation list decoding based on the error check for the first data portion.

In some examples, the SCL decoding component 740 is capable of, configured to, or operable to support a means for selecting, from the set of multiple decoding paths, a decoding path for the first data portion based on the error check for the first data portion. In some examples, the SCL decoding component 740 is capable of, configured to, or operable to support a means for decoding the second data portion based on the selected decoding path for the first data portion.

In some examples, the SCL decoding component 740 is capable of, configured to, or operable to support a means for terminating the decoding process for the polar-encoded code block based on the set of multiple decoding paths failing the error check for the first data portion.

In some examples, the SCL decoding component 740 is capable of, configured to, or operable to support a means for reducing a quantity of bits associated with one or more log-likelihood ratio calculations for the decoding process based on the error check for the first data portion.

In some examples, the polar-encoded code block further includes a second error check portion following the second data portion in accordance with the decoding order for the polar-encoded code block. In some examples, the decoding process is further based on the second error check portion.

In some examples, to support transmitting the first signaling, the location request component 725 is capable of, configured to, or operable to support a means for transmitting an indication of a capability of the UE to decode the polar-encoded code block including multiple error check portions, where the polar-encoded code block includes the first error check portion and the second error check portion based on the capability of the UE.

In some examples, to support transmitting the first signaling, the location request component 725 is capable of, configured to, or operable to support a means for transmitting a request for inclusion of the second error check portion for the polar code construction, where the polar-encoded code block includes the second error check portion based on the request.

In some examples, the second error check portion verifies successful decoding of the first data portion, the second data portion, the first error check portion, or any combination thereof.

In some examples, to support transmitting the first signaling, the location request component 725 is capable of, configured to, or operable to support a means for transmitting an indication for the second error check portion to verify the first data portion, the second data portion, the first error check portion, or any combination thereof.

In some examples, to support transmitting the first signaling, the location request component 725 is capable of, configured to, or operable to support a means for transmitting an indication of a first quantity of bits for the error check portion, a second quantity of bits for a second error check portion, a total quantity of bits for a set of multiple error check portions, or any combination thereof, where the polar-encoded code block is based on the first quantity of bits, the second quantity of bits, the total quantity of bits, or any combination thereof.

In some examples, the first quantity of bits, the second quantity of bits, the total quantity of bits, or any combination thereof is based on a list size for successive cancellation list decoding at the UE.

In some examples, to support transmitting the first signaling, the location request component 725 is capable of, configured to, or operable to support a means for transmitting an indication of a set of multiple candidate locations for inclusion of the error check portion and corresponding reductions in power consumption for the decoding process, the set of multiple candidate locations including the requested location.

In some examples, the location configuration component 750 is capable of, configured to, or operable to support a means for receiving third signaling configuring a location for the error check portion within the set of multiple bit channels for the polar code construction based on the requested location, where the polar-encoded code block includes the first error check portion based on the configured location.

In some examples, the location configuration component 750 is capable of, configured to, or operable to support a means for receiving third signaling configuring a location for the error check portion within the set of multiple bit channels for the polar code construction, where the first signaling is transmitted to request an update to the configured location.

In some examples, the first signaling indicates the requested location based on a lookup table index, a bit channel index, a proportion of the set of multiple bit channels, or any combination thereof.

In some examples, the one or more decoding parameters include a list size for successive cancellation list decoding, a code rate for communications, a rank for communications, or any combination thereof.

In some examples, the first error check portion includes one or more cyclic redundancy check bits.

Figure 8:
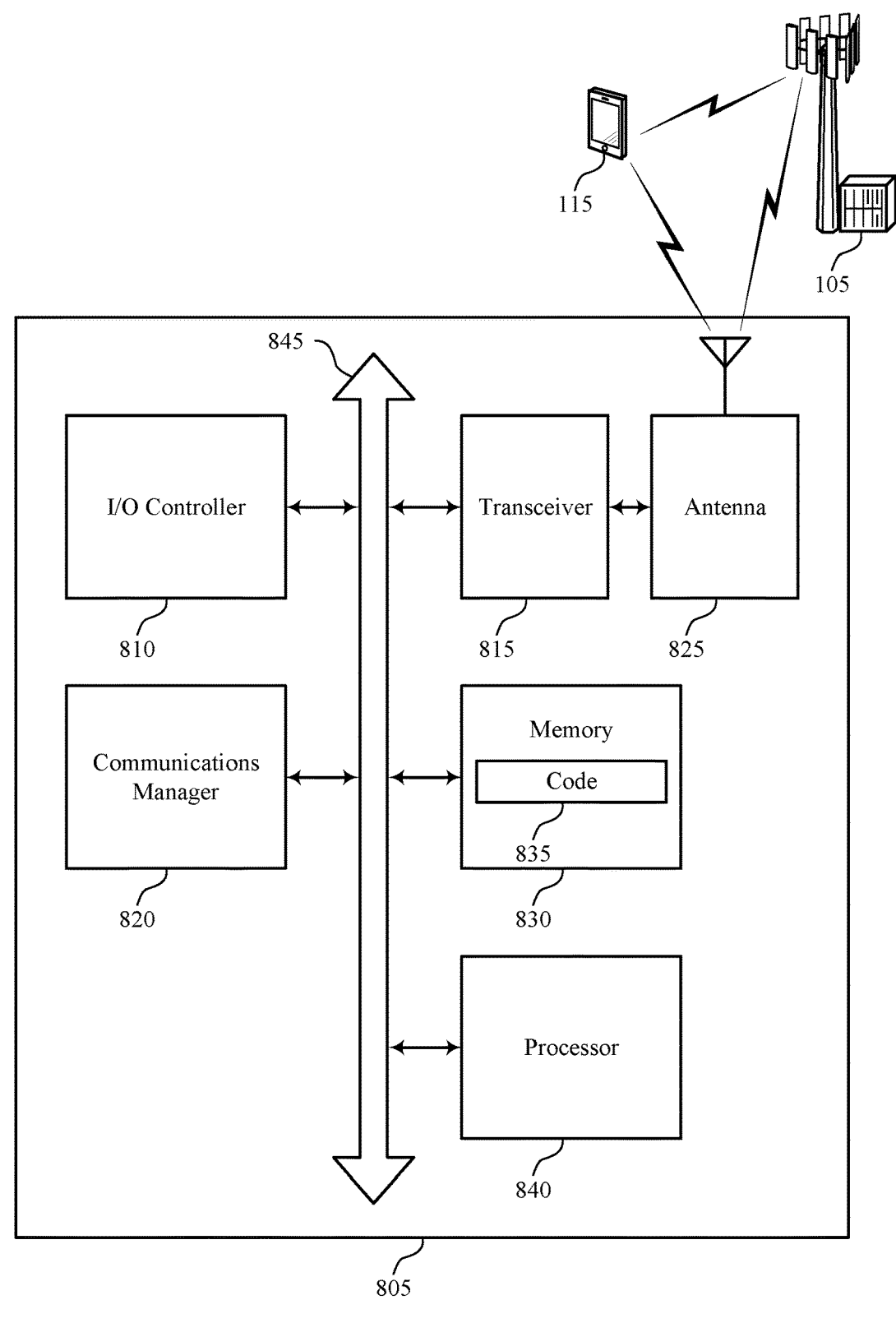
FIG. 8 shows a diagram of a system including a device that supports multi-stage error checking for polar-encoded code blocks in accordance with one or more aspects of the present disclosure.

FIG. 8 shows a diagram of a system 800 including a device 805 that supports multi-stage error checking for polar-encoded code blocks in accordance with one or more aspects of the present disclosure. The device 805 may be an example of or include the components of a device 505, a device 605, or a UE 115 as described herein. The device 805 may communicate (e.g., wirelessly) with one or more network entities 105, one or more UEs 115, or any combination thereof. The device 805 may include components for bi-directional voice and data communications including components for transmitting and receiving communications, such as a communications manager 820, an input/output (I/O) controller 810, a transceiver 815, an antenna 825, at least one memory 830, code 835, and at least one processor 840. These components may be in electronic communication or otherwise coupled (e.g., operatively, communicatively, functionally, electronically, electrically) via one or more buses (e.g., a bus 845).

The I/O controller 810 may manage input and output signals for the device 805. The I/O controller 810 may also manage peripherals not integrated into the device 805. In some cases, the I/O controller 810 may represent a physical connection or port to an external peripheral. In some cases, the I/O controller 810 may utilize an operating system such as iOS®, ANDROID®, MS-DOS®, MS-WINDOWS®, OS/2®, UNIX®, LINUX®, or another known operating system. Additionally, or alternatively, the I/O controller 810 may represent or interact with a modem, a keyboard, a mouse, a touchscreen, or a similar device. In some cases, the I/O controller 810 may be implemented as part of one or more processors, such as the at least one processor 840. In some cases, a user may interact with the device 805 via the I/O controller 810 or via hardware components controlled by the I/O controller 810.

In some cases, the device 805 may include a single antenna 825. However, in some other cases, the device 805 may have more than one antenna 825, which may be capable of concurrently transmitting or receiving multiple wireless transmissions. The transceiver 815 may communicate bi-directionally, via the one or more antennas 825, wired, or wireless links as described herein. For example, the transceiver 815 may represent a wireless transceiver and may communicate bi-directionally with another wireless transceiver. The transceiver 815 may also include a modem to modulate the packets, to provide the modulated packets to one or more antennas 825 for transmission, and to demodulate packets received from the one or more antennas 825. The transceiver 815, or the transceiver 815 and one or more antennas 825, may be an example of a transmitter 515, a transmitter 615, a receiver 510, a receiver 610, or any combination thereof or component thereof, as described herein.

The at least one memory 830 may include random access memory (RAM) and read-only memory (ROM). The at least one memory 830 may store computer-readable, computer-executable code 835 including instructions that, when executed by the at least one processor 840, cause the device 805 to perform various functions described herein. The code 835 may be stored in a non-transitory computer-readable medium such as system memory or another type of memory. In some cases, the code 835 may not be directly executable by the at least one processor 840 but may cause a computer (e.g., when compiled and executed) to perform functions described herein. In some cases, the at least one memory 830 may contain, among other things, a basic I/O system (BIOS) which may control basic hardware or software operation such as the interaction with peripheral components or devices.

The at least one processor 840 may include an intelligent hardware device (e.g., a general-purpose processor, a DSP, a CPU, a GPU, an NPU, a microcontroller, an ASIC, an FPGA, a programmable logic device, a discrete gate or transistor logic component, a discrete hardware component, or any combination thereof). In some cases, the at least one processor 840 may be configured to operate a memory array using a memory controller. In some other cases, a memory controller may be integrated into the at least one processor 840. The at least one processor 840 may be configured to execute computer-readable instructions stored in a memory (e.g., the at least one memory 830) to cause the device 805 to perform various functions (e.g., functions or tasks supporting multi-stage error checking for polar-encoded code blocks). For example, the device 805 or a component of the device 805 may include at least one processor 840 and at least one memory 830 coupled with or to the at least one processor 840, the at least one processor 840 and at least one memory 830 configured to perform various functions described herein. In some examples, the at least one processor 840 may include multiple processors and the at least one memory 830 may include multiple memories. One or more of the multiple processors may be coupled with one or more of the multiple memories, which may, individually or collectively, be configured to perform various functions herein. In some examples, the at least one processor 840 may be a component of a processing system, which may refer to a system (such as a series) of machines, circuitry (including, for example, one or both of processor circuitry (which may include the at least one processor 840) and memory circuitry (which may include the at least one memory 830)), or components, that receives or obtains inputs and processes the inputs to produce, generate, or obtain a set of outputs. The processing system may be configured to perform one or more of the functions described herein. As such, the at least one processor 840 or a processing system including the at least one processor 840 may be configured to, configurable to, or operable to cause the device 805 to perform one or more of the functions described herein. Further, as described herein, being "configured to," being "configurable to," and being "operable to" may be used interchangeably and may be associated with a capability, when executing code stored in the at least one memory 830 or otherwise, to perform one or more of the functions described herein.

The communications manager 820 may support wireless communication in accordance with examples as disclosed herein. For example, the communications manager 820 is capable of, configured to, or operable to support a means for transmitting first signaling indicating a requested location for inclusion of an error check portion within a set of multiple bit channels for polar code construction, the requested location based on one or more decoding parameters of the UE. The communications manager 820 is capable of, configured to, or operable to support a means for receiving a polar-encoded code block including a first data portion, a first error check portion, and a second data portion, the first error check portion following the first data portion and preceding the second data portion in accordance with a decoding order for the polar-encoded code block based on the requested location for inclusion of the error check portion. The communications manager 820 is capable of, configured to, or operable to support a means for communicating second signaling based on a decoding process for the polar-encoded code block, the decoding process based on the first error check portion.

By including or configuring the communications manager 820 in accordance with examples as described herein, the device 805 may support techniques for reduced latency and longer battery life. For example, a device 805 (e.g., a UE 115) implementing the techniques described herein may perform SCL decoding for part of a polar-encoded message using a list of a relatively smaller size, reducing power consumption and latency of the device 505.

In some examples, the communications manager 820 may be configured to perform various operations (e.g., receiving, monitoring, transmitting) using or otherwise in cooperation with the transceiver 815, the one or more antennas 825, or any combination thereof. Although the communications manager 820 is illustrated as a separate component, in some examples, one or more functions described with reference to the communications manager 820 may be supported by or performed by the at least one processor 840, the at least one memory 830, the code 835, or any combination thereof. For example, the code 835 may include instructions executable by the at least one processor 840 to cause the device 805 to perform various aspects of multi-stage error checking for polar-encoded code blocks as described herein, or the at least one processor 840 and the at least one memory 830 may be otherwise configured to, individually or collectively, perform or support such operations.

Figure 9:
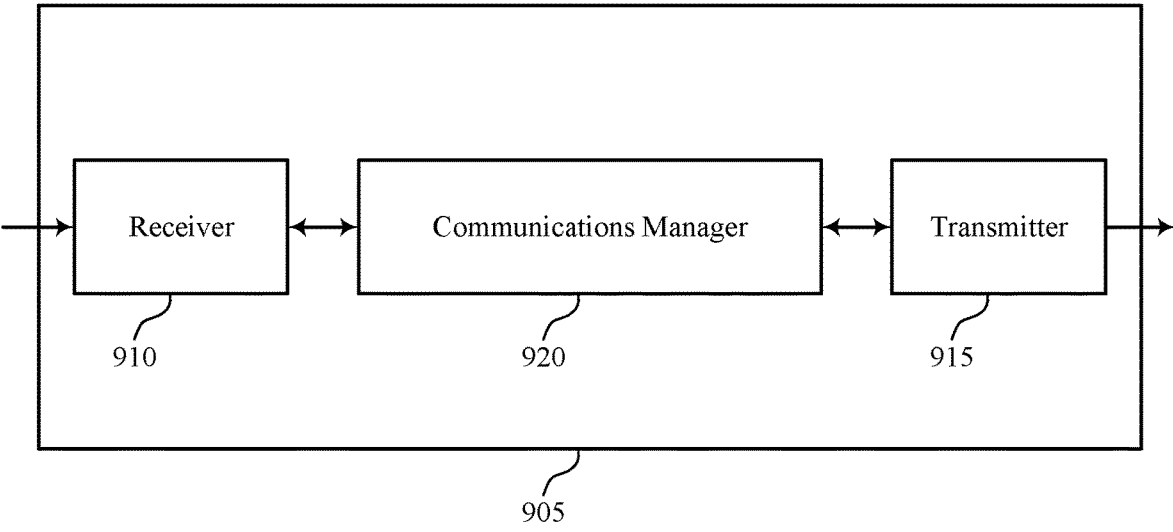
FIGS. 9 and 10 show block diagrams of devices that support multi-stage error checking for polar-encoded code blocks in accordance with one or more aspects of the present disclosure.

FIG. 9 shows a block diagram 900 of a device 905 that supports multi-stage error checking for polar-encoded code blocks in accordance with one or more aspects of the present disclosure. The device 905 may be an example of aspects of a network entity 105 as described herein. The device 905 may include a receiver 910, a transmitter 915, and a communications manager 920. The device 905, or one or more components of the device 905 (e.g., the receiver 910, the transmitter 915, and the communications manager 920), may include at least one processor, which may be coupled with at least one memory, to, individually or collectively, support or enable the described techniques. Each of these components may be in communication with one another (e.g., via one or more buses).

The receiver 910 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 905. In some examples, the receiver 910 may support obtaining information by receiving signals via one or more antennas. Additionally, or alternatively, the receiver 910 may support obtaining information by receiving signals via one or more wired (e.g., electrical, fiber optic) interfaces, wireless interfaces, or any combination thereof.

The transmitter 915 may provide a means for outputting (e.g., transmitting, providing, conveying, sending) information generated by other components of the device 905. For example, the transmitter 915 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 915 may support outputting information by transmitting signals via one or more antennas. Additionally, or alternatively, the transmitter 915 may support outputting information by transmitting signals via one or more wired (e.g., electrical, fiber optic) interfaces, wireless interfaces, or any combination thereof. In some examples, the transmitter 915 and the receiver 910 may be co-located in a transceiver, which may include or be coupled with a modem.

The communications manager 920, the receiver 910, the transmitter 915, or various combinations thereof or various components thereof may be examples of means for performing various aspects of multi-stage error checking for polar-encoded code blocks as described herein. For example, the communications manager 920, the receiver 910, the transmitter 915, or various combinations or components thereof may be capable of performing one or more of the functions described herein.

In some examples, the communications manager 920, the receiver 910, the transmitter 915, or various combinations or components thereof may be implemented in hardware (e.g., in communications management circuitry). The hardware may include at least one of a processor, a DSP, a CPU, a GPU, an NPU, an ASIC, an FPGA or other programmable logic device, a microcontroller, discrete gate or transistor logic, discrete hardware components, or any combination thereof configured as or otherwise supporting, individually or collectively, a means for performing the functions described in the present disclosure. In some examples, at least one processor and at least one memory coupled with the at least one processor may be configured to perform one or more of the functions described herein (e.g., by one or more processors, individually or collectively, executing instructions stored in the at least one memory).

Additionally, or alternatively, the communications manager 920, the receiver 910, the transmitter 915, or various combinations or components thereof may be implemented in code (e.g., as communications management software) executed by at least one processor. If implemented in code executed by at least one processor, the functions of the communications manager 920, the receiver 910, the transmitter 915, or various combinations or components thereof may be performed by a general-purpose processor, a DSP, a CPU, a GPU, an NPU, an ASIC, an FPGA, a microcontroller, or any combination of these or other programmable logic devices (e.g., configured as or otherwise supporting, individually or collectively, a means for performing the functions described in the present disclosure).

In some examples, the communications manager 920 may be configured to perform various operations (e.g., receiving, obtaining, monitoring, outputting, transmitting) using or otherwise in cooperation with the receiver 910, the transmitter 915, or both. For example, the communications manager 920 may receive information from the receiver 910, send information to the transmitter 915, or be integrated in combination with the receiver 910, the transmitter 915, or both to obtain information, output information, or perform various other operations as described herein.

The communications manager 920 may support wireless communications in accordance with examples as disclosed herein. For example, the communications manager 920 is capable of, configured to, or operable to support a means for obtaining first signaling indicating a requested location for inclusion of an error check portion within a set of multiple bit channels for polar code construction, the requested location based on one or more decoding parameters of a UE. The communications manager 920 is capable of, configured to, or operable to support a means for outputting a polar-encoded code block including a first data portion, a first error check portion, and a second data portion, the first error check portion following the first data portion and preceding the second data portion in accordance with a decoding order for the polar-encoded code block based on the requested location for inclusion of the error check portion. The communications manager 920 is capable of, configured to, or operable to support a means for communicating second signaling based on the polar-encoded code block.

By including or configuring the communications manager 920 in accordance with examples as described herein, the device 905 (e.g., at least one processor controlling or otherwise coupled with the receiver 910, the transmitter 915, the communications manager 920, or a combination thereof) may support techniques for more efficient utilization of communication resources. For example, a device 905 (e.g., a network entity 105) utilizing the techniques described herein may communicate polar-encoded signaling with less error, causing less retransmissions and saving communication resources.

Figure 10:
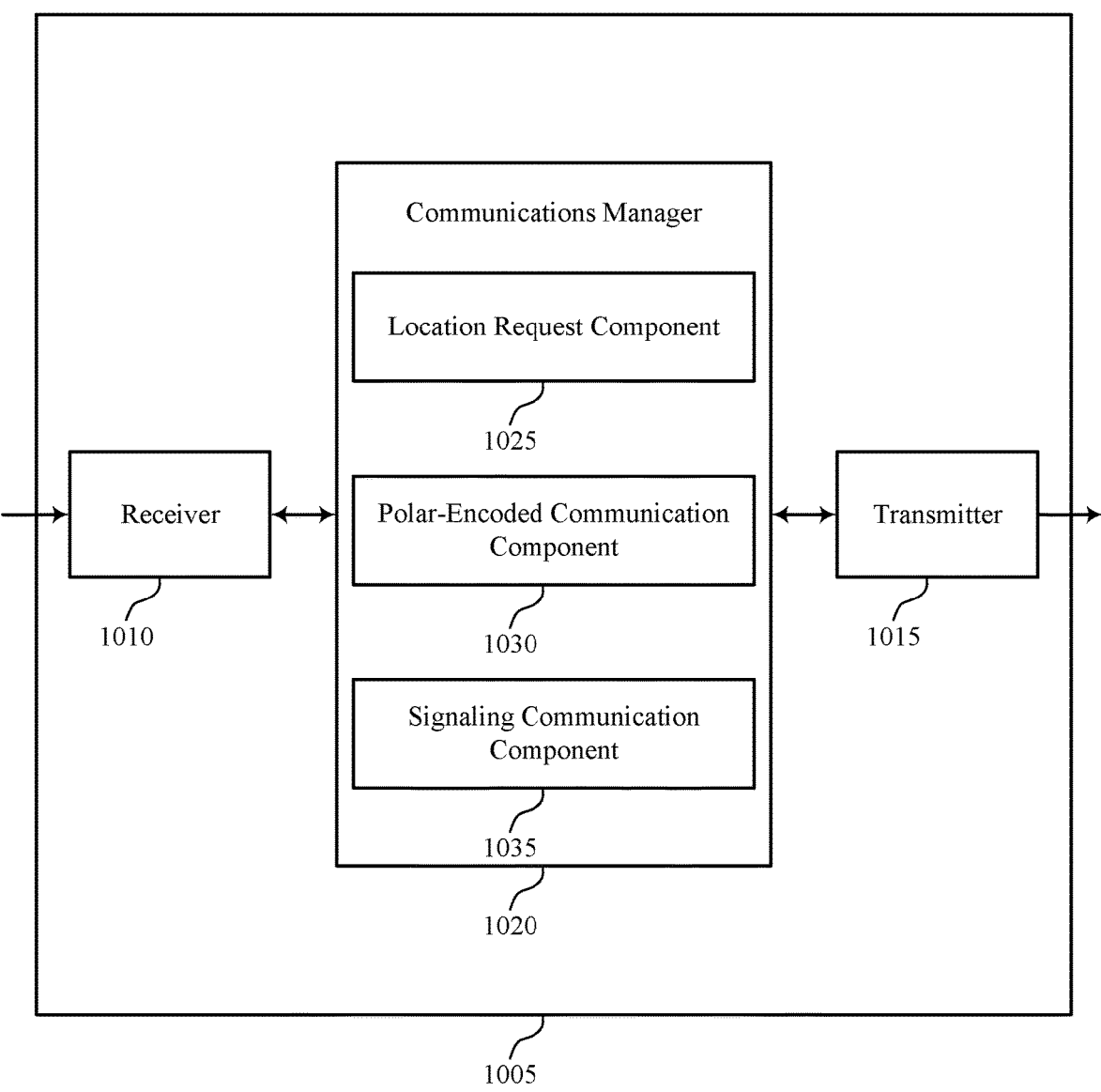

FIG. 10 shows a block diagram 1000 of a device 1005 that supports multi-stage error checking for polar-encoded code blocks in accordance with one or more aspects of the present disclosure. The device 1005 may be an example of aspects of a device 905 or a network entity 105 as described herein. The device 1005 may include a receiver 1010, a transmitter 1015, and a communications manager 1020. The device 1005, or one or more components of the device 1005 (e.g., the receiver 1010, the transmitter 1015, and the communications manager 1020), may include at least one processor, which may be coupled with at least one memory, to support the described techniques. Each of these components may be in communication with one another (e.g., via one or more buses).

The receiver 1010 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 1005. In some examples, the receiver 1010 may support obtaining information by receiving signals via one or more antennas. Additionally, or alternatively, the receiver 1010 may support obtaining information by receiving signals via one or more wired (e.g., electrical, fiber optic) interfaces, wireless interfaces, or any combination thereof.

The transmitter 1015 may provide a means for outputting (e.g., transmitting, providing, conveying, sending) information generated by other components of the device 1005. For example, the transmitter 1015 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 1015 may support outputting information by transmitting signals via one or more antennas. Additionally, or alternatively, the transmitter 1015 may support outputting information by transmitting signals via one or more wired (e.g., electrical, fiber optic) interfaces, wireless interfaces, or any combination thereof. In some examples, the transmitter 1015 and the receiver 1010 may be co-located in a transceiver, which may include or be coupled with a modem.

The device 1005, or various components thereof, may be an example of means for performing various aspects of multi-stage error checking for polar-encoded code blocks as described herein. For example, the communications manager 1020 may include a location request component 1025, a polar-encoded communication component 1030, a signaling communication component 1035, or any combination thereof. The communications manager 1020 may be an example of aspects of a communications manager 920 as described herein. In some examples, the communications manager 1020, or various components thereof, may be configured to perform various operations (e.g., receiving, obtaining, monitoring, outputting, transmitting) using or otherwise in cooperation with the receiver 1010, the transmitter 1015, or both. For example, the communications manager 1020 may receive information from the receiver 1010, send information to the transmitter 1015, or be integrated in combination with the receiver 1010, the transmitter 1015, or both to obtain information, output information, or perform various other operations as described herein.

The communications manager 1020 may support wireless communications in accordance with examples as disclosed herein. The location request component 1025 is capable of, configured to, or operable to support a means for obtaining first signaling indicating a requested location for inclusion of an error check portion within a set of multiple bit channels for polar code construction, the requested location based on one or more decoding parameters of a UE. The polar-encoded communication component 1030 is capable of, configured to, or operable to support a means for outputting a polar-encoded code block including a first data portion, a first error check portion, and a second data portion, the first error check portion following the first data portion and preceding the second data portion in accordance with a decoding order for the polar-encoded code block based on the requested location for inclusion of the error check portion. The signaling communication component 1035 is capable of, configured to, or operable to support a means for communicating second signaling based on the polar-encoded code block.

Figure 11:
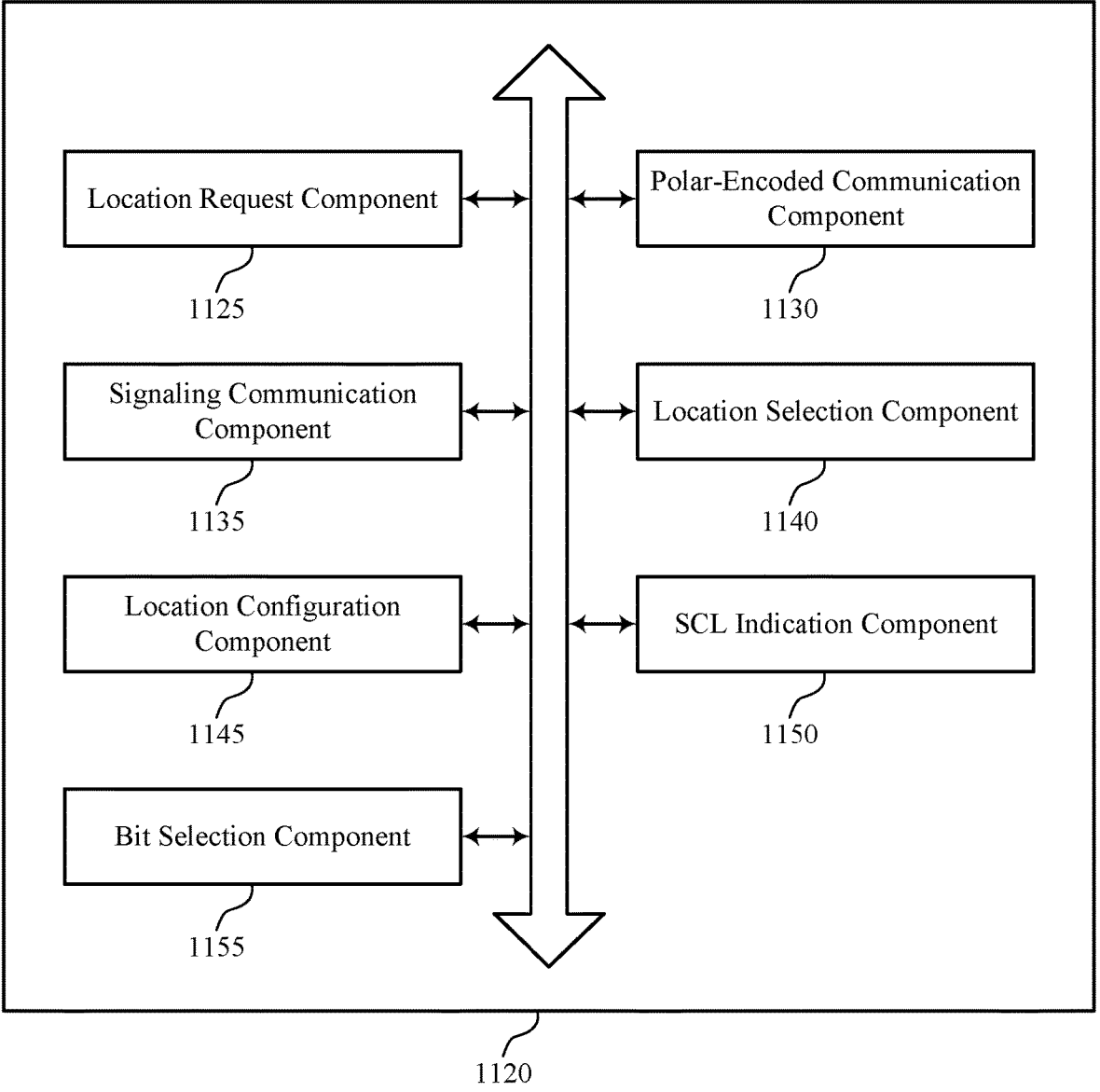
FIG. 11 shows a block diagram of a communications manager that supports multi-stage error checking for polar-encoded code blocks in accordance with one or more aspects of the present disclosure.

FIG. 11 shows a block diagram 1100 of a communications manager 1120 that supports multi-stage error checking for polar-encoded code blocks in accordance with one or more aspects of the present disclosure. The communications manager 1120 may be an example of aspects of a communications manager 920, a communications manager 1020, or both, as described herein. The communications manager 1120, or various components thereof, may be an example of means for performing various aspects of multi-stage error checking for polar-encoded code blocks as described herein. For example, the communications manager 1120 may include a location request component 1125, a polar-encoded communication component 1130, a signaling communication component 1135, a location selection component 1140, a location configuration component 1145, an SCL indication component 1150, a bit selection component 1155, or any combination thereof. Each of these components, or components or subcomponents thereof (e.g., one or more processors, one or more memories), may communicate, directly or indirectly, with one another (e.g., via one or more buses) which may include communications within a protocol layer of a protocol stack, communications associated with a logical channel of a protocol stack (e.g., between protocol layers of a protocol stack, within a device, component, or virtualized component associated with a network entity 105, between devices, components, or virtualized components associated with a network entity 105), or any combination thereof.

The communications manager 1120 may support wireless communications in accordance with examples as disclosed herein. The location request component 1125 is capable of, configured to, or operable to support a means for obtaining first signaling indicating a requested location for inclusion of an error check portion within a set of multiple bit channels for polar code construction, the requested location based on one or more decoding parameters of a UE. The polar-encoded communication component 1130 is capable of, configured to, or operable to support a means for outputting a polar-encoded code block including a first data portion, a first error check portion, and a second data portion, the first error check portion following the first data portion and preceding the second data portion in accordance with a decoding order for the polar-encoded code block based on the requested location for inclusion of the error check portion. The signaling communication component 1135 is capable of, configured to, or operable to support a means for communicating second signaling based on the polar-encoded code block.

In some examples, the location selection component 1140 is capable of, configured to, or operable to support a means for selecting a location for the error check portion within the set of multiple bit channels for the polar code construction based on the requested location. In some examples, the location configuration component 1145 is capable of, configured to, or operable to support a means for outputting third signaling configuring the location for the error check portion based on the selecting, where the polar-encoded code block includes the first error check portion based on the configured location.

In some examples, to support obtaining the first signaling, the location request component 1125 is capable of, configured to, or operable to support a means for obtaining an indication of a set of multiple candidate locations for inclusion of the error check portion and corresponding reductions in power consumption at the UE, the set of multiple candidate locations including the requested location, where the location is selected based on the set of multiple candidate locations, the reductions in power consumption, or both.

In some examples, the polar-encoded code block further includes a second error check portion following the second data portion in accordance with the decoding order for the polar-encoded code block.

In some examples, the bit selection component 1155 is capable of, configured to, or operable to support a means for selecting a first quantity of bits for the first error check portion, a second quantity of bits for the second error check portion, or both, where the polar-encoded code block is based on the first quantity of bits, the second quantity of bits, or both.

In some examples, to support obtaining the first signaling, the location request component 1125 is capable of, configured to, or operable to support a means for obtaining an indication of the first quantity of bits, the second quantity of bits, a total quantity of bits for a set of multiple error check portions, or any combination thereof, where the selecting is based on the first quantity of bits, the second quantity of bits, the total quantity of bits, or any combination thereof.

In some examples, the SCL indication component 1150 is capable of, configured to, or operable to support a means for obtaining third signaling indicating that a second UE uses a successive cancellation decoder with a single decoding path. In some examples, the location selection component 1140 is capable of, configured to, or operable to support a means for selecting a location for the error check portion for the second UE based on the second UE using the successive cancellation decoder with the single decoding path.

In some examples, the first error check portion includes one or more cyclic redundancy check bits.

Figure 12:
FIG. 12 shows a diagram of a system including a device that supports multi-stage error checking for polar-encoded code blocks in accordance with one or more aspects of the present disclosure.

FIG. 12 shows a diagram of a system 1200 including a device 1205 that supports multi-stage error checking for polar-encoded code blocks in accordance with one or more aspects of the present disclosure. The device 1205 may be an example of or include the components of a device 905, a device 1005, or a network entity 105 as described herein. The device 1205 may communicate with one or more network entities 105, one or more UEs 115, or any combination thereof, which may include communications over one or more wired interfaces, over one or more wireless interfaces, or any combination thereof. The device 1205 may include components that support outputting and obtaining communications, such as a communications manager 1220, a transceiver 1210, an antenna 1215, at least one memory 1225, code 1230, and at least one processor 1235. These components may be in electronic communication or otherwise coupled (e.g., operatively, communicatively, functionally, electronically, electrically) via one or more buses (e.g., a bus 1240).

The transceiver 1210 may support bi-directional communications via wired links, wireless links, or both as described herein. In some examples, the transceiver 1210 may include a wired transceiver and may communicate bi-directionally with another wired transceiver. Additionally, or alternatively, in some examples, the transceiver 1210 may include a wireless transceiver and may communicate bi-directionally with another wireless transceiver. In some examples, the device 1205 may include one or more antennas 1215, which may be capable of transmitting or receiving wireless transmissions (e.g., concurrently). The transceiver 1210 may also include a modem to modulate signals, to provide the modulated signals for transmission (e.g., by one or more antennas 1215, by a wired transmitter), to receive modulated signals (e.g., from one or more antennas 1215, from a wired receiver), and to demodulate signals. In some implementations, the transceiver 1210 may include one or more interfaces, such as one or more interfaces coupled with the one or more antennas 1215 that are configured to support various receiving or obtaining operations, or one or more interfaces coupled with the one or more antennas 1215 that are configured to support various transmitting or outputting operations, or a combination thereof. In some implementations, the transceiver 1210 may include or be configured for coupling with one or more processors or one or more memory components that are operable to perform or support operations based on received or obtained information or signals, or to generate information or other signals for transmission or other outputting, or any combination thereof. In some implementations, the transceiver 1210, or the transceiver 1210 and the one or more antennas 1215, or the transceiver 1210 and the one or more antennas 1215 and one or more processors or one or more memory components (e.g., the at least one processor 1235, the at least one memory 1225, or both), may be included in a chip or chip assembly that is installed in the device 1205. In some examples, the transceiver 1210 may be operable to support communications via one or more communications links (e.g., a communication link 125, a backhaul communication link 120, a midhaul communication link 162, a fronthaul communication link 168).

The at least one memory 1225 may include RAM, ROM, or any combination thereof. The at least one memory 1225 may store computer-readable, computer-executable code 1230 including instructions that, when executed by one or more of the at least one processor 1235, cause the device 1205 to perform various functions described herein. The code 1230 may be stored in a non-transitory computer-readable medium such as system memory or another type of memory. In some cases, the code 1230 may not be directly executable by a processor of the at least one processor 1235 but may cause a computer (e.g., when compiled and executed) to perform functions described herein. In some cases, the at least one memory 1225 may contain, among other things, a BIOS which may control basic hardware or software operation such as the interaction with peripheral components or devices. In some examples, the at least one processor 1235 may include multiple processors and the at least one memory 1225 may include multiple memories. One or more of the multiple processors may be coupled with one or more of the multiple memories which may, individually or collectively, be configured to perform various functions herein (for example, as part of a processing system).

The at least one processor 1235 may include an intelligent hardware device (e.g., a general-purpose processor, a DSP, an ASIC, a CPU, a GPU, an NPU, an FPGA, a microcontroller, a programmable logic device, discrete gate or transistor logic, a discrete hardware component, or any combination thereof). In some cases, the at least one processor 1235 may be configured to operate a memory array using a memory controller. In some other cases, a memory controller may be integrated into one or more of the at least one processor 1235. The at least one processor 1235 may be configured to execute computer-readable instructions stored in a memory (e.g., one or more of the at least one memory 1225) to cause the device 1205 to perform various functions (e.g., functions or tasks supporting multi-stage error checking for polar-encoded code blocks). For example, the device 1205 or a component of the device 1205 may include at least one processor 1235 and at least one memory 1225 coupled with one or more of the at least one processor 1235, the at least one processor 1235 and the at least one memory 1225 configured to perform various functions described herein. The at least one processor 1235 may be an example of a cloud-computing platform (e.g., one or more physical nodes and supporting software such as operating systems, virtual machines, or container instances) that may host the functions (e.g., by executing code 1230) to perform the functions of the device 1205. The at least one processor 1235 may be any one or more suitable processors capable of executing scripts or instructions of one or more software programs stored in the device 1205 (such as within one or more of the at least one memory 1225). In some examples, the at least one processor 1235 may include multiple processors and the at least one memory 1225 may include multiple memories. One or more of the multiple processors may be coupled with one or more of the multiple memories, which may, individually or collectively, be configured to perform various functions herein. In some examples, the at least one processor 1235 may be a component of a processing system, which may refer to a system (such as a series) of machines, circuitry (including, for example, one or both of processor circuitry (which may include the at least one processor 1235) and memory circuitry (which may include the at least one memory 1225)), or components, that receives or obtains inputs and processes the inputs to produce, generate, or obtain a set of outputs. The processing system may be configured to perform one or more of the functions described herein. As such, the at least one processor 1235 or a processing system including the at least one processor 1235 may be configured to, configurable to, or operable to cause the device 1205 to perform one or more of the functions described herein. Further, as described herein, being "configured to," being "configurable to," and being "operable to" may be used interchangeably and may be associated with a capability, when executing code stored in the at least one memory 1225 or otherwise, to perform one or more of the functions described herein.

In some examples, a bus 1240 may support communications of (e.g., within) a protocol layer of a protocol stack. In some examples, a bus 1240 may support communications associated with a logical channel of a protocol stack (e.g., between protocol layers of a protocol stack), which may include communications performed within a component of the device 1205, or between different components of the device 1205 that may be co-located or located in different locations (e.g., where the device 1205 may refer to a system in which one or more of the communications manager 1220, the transceiver 1210, the at least one memory 1225, the code 1230, and the at least one processor 1235 may be located in one of the different components or divided between different components).

In some examples, the communications manager 1220 may manage aspects of communications with a core network 130 (e.g., via one or more wired or wireless backhaul links). For example, the communications manager 1220 may manage the transfer of data communications for client devices, such as one or more UEs 115. In some examples, the communications manager 1220 may manage communications with other network entities 105, and may include a controller or scheduler for controlling communications with UEs 115 in cooperation with other network entities 105. In some examples, the communications manager 1220 may support an X2 interface within an LTE/LTE-A wireless communications network technology to provide communication between network entities 105.

The communications manager 1220 may support wireless communications in accordance with examples as disclosed herein. For example, the communications manager 1220 is capable of, configured to, or operable to support a means for obtaining first signaling indicating a requested location for inclusion of an error check portion within a set of multiple bit channels for polar code construction, the requested location based on one or more decoding parameters of a UE. The communications manager 1220 is capable of, configured to, or operable to support a means for outputting a polar-encoded code block including a first data portion, a first error check portion, and a second data portion, the first error check portion following the first data portion and preceding the second data portion in accordance with a decoding order for the polar-encoded code block based on the requested location for inclusion of the error check portion. The communications manager 1220 is capable of, configured to, or operable to support a means for communicating second signaling based on the polar-encoded code block.

By including or configuring the communications manager 1220 in accordance with examples as described herein, the device 1205 may support techniques for improved communication reliability and more efficient utilization of communication resources. For example, a device 1205 (e.g., a network entity 105) utilizing the techniques described herein may communicate polar-encoded signaling with multiple error check portions, causing less retransmissions (e.g., increasing reliability that a receiving device will decode the polar-encoded signaling correctly) and saving communication resources.

In some examples, the communications manager 1220 may be configured to perform various operations (e.g., receiving, obtaining, monitoring, outputting, transmitting) using or otherwise in cooperation with the transceiver 1210, the one or more antennas 1215 (e.g., where applicable), or any combination thereof. Although the communications manager 1220 is illustrated as a separate component, in some examples, one or more functions described with reference to the communications manager 1220 may be supported by or performed by the transceiver 1210, one or more of the at least one processor 1235, one or more of the at least one memory 1225, the code 1230, or any combination thereof (for example, by a processing system including at least a portion of the at least one processor 1235, the at least one memory 1225, the code 1230, or any combination thereof). For example, the code 1230 may include instructions executable by one or more of the at least one processor 1235 to cause the device 1205 to perform various aspects of multi-stage error checking for polar-encoded code blocks as described herein, or the at least one processor 1235 and the at least one memory 1225 may be otherwise configured to, individually or collectively, perform or support such operations.

FIG. 13 shows a flowchart illustrating a method 1300 that supports multi-stage error checking for polar-encoded code blocks in accordance with aspects of the present disclosure. The operations of the method 1300 may be implemented by a UE or its components as described herein. For example, the operations of the method 1300 may be performed by a UE 115 as described with reference to FIGS. 1 through 8. In some examples, a UE may execute a set of instructions to control the functional elements of the UE to perform the described functions. Additionally, or alternatively, the UE may perform aspects of the described functions using special-purpose hardware.

At 1305, the method may include transmitting first signaling indicating a requested location for inclusion of an error check portion within a plurality of bit channels for polar code construction, the requested location based at least in part on one or more decoding parameters of the UE. The operations of block 1305 may be performed in accordance with examples as disclosed herein. In some examples, aspects of the operations of 1305 may be performed by a location request component 725 as described with reference to FIG. 7.

At 1310, the method may include receiving a polar-encoded code block including a first data portion, a first error check portion, and a second data portion, the first error check portion following the first data portion and preceding the second data portion in accordance with a decoding order for the polar-encoded code block based at least in part on the requested location for inclusion of the error check portion. The operations of block 1310 may be performed in accordance with examples as disclosed herein. In some examples, aspects of the operations of 1310 may be performed by a polar-encoded communication component 730 as described with reference to FIG. 7.

At 1315, the method may include communicating second signaling based at least in part on a decoding process for the polar-encoded code block, the decoding process based at least in part on the first error check portion. The operations of block 1315 may be performed in accordance with examples as disclosed herein. In some examples, aspects of the operations of 1315 may be performed by a signaling communication component 735 as described with reference to FIG. 7.

FIG. 14 shows a flowchart illustrating a method 1400 that supports multi-stage error checking for polar-encoded code blocks in accordance with aspects of the present disclosure. The operations of the method 1400 may be implemented by a network entity or its components as described herein. For example, the operations of the method 1400 may be performed by a network entity as described with reference to FIGS. 1 through 4 and 9 through 12. In some examples, a network entity may execute a set of instructions to control the functional elements of the network entity to perform the described functions. Additionally, or alternatively, the network entity may perform aspects of the described functions using special-purpose hardware.

At 1405, the method may include obtaining first signaling indicating a requested location for inclusion of an error check portion within a plurality of bit channels for polar code construction, the requested location based at least in part on one or more decoding parameters of a UE. The operations of block 1405 may be performed in accordance with examples as disclosed herein. In some examples, aspects of the operations of 1405 may be performed by a location request component 1125 as described with reference to FIG. 11.

At 1410, the method may include outputting a polar-encoded code block including a first data portion, a first error check portion, and a second data portion, the first error check portion following the first data portion and preceding the second data portion in accordance with a decoding order for the polar-encoded code block based at least in part on the requested location for inclusion of the error check portion. The operations of block 1410 may be performed in accordance with examples as disclosed herein. In some examples, aspects of the operations of 1410 may be performed by a polar-encoded communication component 1130 as described with reference to FIG. 11.

At 1415, the method may include communicating second signaling based at least in part on the polar-encoded code block. The operations of block 1415 may be performed in accordance with examples as disclosed herein. In some examples, aspects of the operations of 1415 may be performed by a signaling communication component 1135 as described with reference to FIG. 11.

The following provides an overview of aspects of the present disclosure:

Aspect 1: A method for wireless communication at a UE, comprising: transmitting first signaling indicating a requested location for inclusion of an error check portion within a plurality of bit channels for polar code construction, the requested location based at least in part on one or more decoding parameters of the UE; receiving a polar-encoded code block comprising a first data portion, a first error check portion, and a second data portion, the first error check portion following the first data portion and preceding the second data portion in accordance with a decoding order for the polar-encoded code block based at least in part on the requested location for inclusion of the error check portion; and communicating second signaling based at least in part on a decoding process for the polar-encoded code block, the decoding process based at least in part on the first error check portion.

Aspect 2: The method of aspect 1, further comprising: decoding the first data portion according to a plurality of decoding paths corresponding to a first list size for SCL decoding; and performing an error check for the first data portion using the first error check portion.

Aspect 3: The method of aspect 2, further comprising: decoding the second data portion according to one or more decoding paths corresponding to a second list size different from the first list size for the SCL decoding based at least in part on the error check for the first data portion.

Aspect 4: The method of either of aspects 2 or 3, further comprising: selecting, from the plurality of decoding paths, a decoding path for the first data portion based at least in part on the error check for the first data portion; and decoding the second data portion based at least in part on the selected decoding path for the first data portion.

Aspect 5: The method of aspect 2 further comprising: terminating the decoding process for the polar-encoded code block based at least in part on the plurality of decoding paths failing the error check for the first data portion.

Aspect 6: The method of any of aspects 2 through 5, further comprising: reducing a quantity of bits associated with one or more LLR calculations for the decoding process based at least in part on the error check for the first data portion.

Aspect 7: The method of any of aspects 1 through 6, wherein the polar-encoded code block further comprises a second error check portion following the second data portion in accordance with the decoding order for the polar-encoded code block; and the decoding process is further based at least in part on the second error check portion.

Aspect 8: The method of aspect 7, wherein transmitting the first signaling comprises: transmitting an indication of a capability of the UE to decode the polar-encoded code block comprising multiple error check portions, wherein the polar-encoded code block comprises the first error check portion and the second error check portion based at least in part on the capability of the UE.

Aspect 9: The method of either of aspects 7 or 8, wherein transmitting the first signaling comprises: transmitting a request for inclusion of the second error check portion for the polar code construction, wherein the polar-encoded code block comprises the second error check portion based at least in part on the request.

Aspect 10: The method of any of aspects 7 through 9, wherein the second error check portion verifies successful decoding of the first data portion, the second data portion, the first error check portion, or any combination thereof.

Aspect 11: The method of aspect 10, wherein transmitting the first signaling comprises: transmitting an indication for the second error check portion to verify the first data portion, the second data portion, the first error check portion, or any combination thereof.

Aspect 12: The method of any of aspects 1 through 11, wherein transmitting the first signaling comprises: transmitting an indication of a first quantity of bits for the error check portion, a second quantity of bits for a second error check portion, a total quantity of bits for a plurality of error check portions, or any combination thereof, wherein the polar-encoded code block is based at least in part on the first quantity of bits, the second quantity of bits, the total quantity of bits, or any combination thereof.

Aspect 13: The method of aspect 12, wherein the first quantity of bits, the second quantity of bits, the total quantity of bits, or any combination thereof is based at least in part on a list size for SCL decoding at the UE.

Aspect 14: The method of any of aspects 1 through 13, wherein transmitting the first signaling comprises: transmitting an indication of a plurality of candidate locations for inclusion of the error check portion and corresponding reductions in power consumption for the decoding process, the plurality of candidate locations comprising the requested location.

Aspect 15: The method of any of aspects 1 through 14, further comprising: receiving third signaling configuring a location for the error check portion within the plurality of bit channels for the polar code construction based at least in part on the requested location, wherein the polar-encoded code block comprises the first error check portion based at least in part on the configured location.

Aspect 16: The method of any of aspects 1 through 15, further comprising: receiving third signaling configuring a location for the error check portion within the plurality of bit channels for the polar code construction, wherein the first signaling is transmitted to request an update to the configured location.

Aspect 17: The method of any of aspects 1 through 16, wherein the first signaling indicates the requested location based at least in part on a lookup table index, a bit channel index, a proportion of the plurality of bit channels, or any combination thereof.

Aspect 18: The method of any of aspects 1 through 17, wherein the one or more decoding parameters comprise a list size for SCL decoding, a code rate for communications, a rank for communications, or any combination thereof.

Aspect 19: The method of any of aspects 1 through 18, wherein the first error check portion comprises one or more CRC bits.

Aspect 20: A method for wireless communications at a network entity, comprising: obtaining first signaling indicating a requested location for inclusion of an error check portion within a plurality of bit channels for polar code construction, the requested location based at least in part on one or more decoding parameters of a UE; outputting a polar-encoded code block comprising a first data portion, a first error check portion, and a second data portion, the first error check portion following the first data portion and preceding the second data portion in accordance with a decoding order for the polar-encoded code block based at least in part on the requested location for inclusion of the error check portion; and communicating second signaling based at least in part on the polar-encoded code block.

Aspect 21: The method of aspect 20, further comprising: selecting a location for the error check portion within the plurality of bit channels for the polar code construction based at least in part on the requested location; and outputting third signaling configuring the location for the error check portion based at least in part on the selecting, wherein the polar-encoded code block comprises the first error check portion based at least in part on the configured location.

Aspect 22: The method of aspect 21, wherein obtaining the first signaling comprises: obtaining an indication of a plurality of candidate locations for inclusion of the error check portion and corresponding reductions in power consumption at the UE, the plurality of candidate locations comprising the requested location, wherein the location is selected based at least in part on the plurality of candidate locations, the reductions in power consumption, or both.

Aspect 23: The method of any of aspects 20 through 22, wherein the polar-encoded code block further comprises a second error check portion following the second data portion in accordance with the decoding order for the polar-encoded code block.

Aspect 24: The method of aspect 23, further comprising: selecting a first quantity of bits for the first error check portion, a second quantity of bits for the second error check portion, or both, wherein the polar-encoded code block is based at least in part on the first quantity of bits, the second quantity of bits, or both.

Aspect 25: The method of aspect 24, wherein obtaining the first signaling comprises: obtaining an indication of the first quantity of bits, the second quantity of bits, a total quantity of bits for a plurality of error check portions, or any combination thereof, wherein the selecting is based at least in part on the first quantity of bits, the second quantity of bits, the total quantity of bits, or any combination thereof.

Aspect 26: The method of any of aspects 20 through 25, further comprising: obtaining third signaling indicating that a second UE uses a successive cancellation decoder with a single decoding path; and selecting a location for the error check portion for the second UE based at least in part on the second UE using the successive cancellation decoder with the single decoding path.

Aspect 27: The method of any of aspects 20 through 26, wherein the first error check portion comprises one or more CRC bits.

Aspect 28: A UE, comprising: one or more memories storing processor-executable code; and one or more processors coupled with (e.g., operatively, communicatively, functionally, electronically, or electrically) the one or more memories and individually or collectively operable to execute the code (e.g., directly, indirectly, after pre-processing, without pre-processing) to cause the UE to perform a method of any of aspects 1 through 19.

Aspect 29: A UE for wireless communication, comprising at least one means for performing a method of any of aspects 1 through 19.

Aspect 30: A non-transitory computer-readable medium storing code for wireless communication, the code comprising instructions executable by one or more processors (e.g., directly, indirectly, after pre-processing, without pre-processing) to perform a method of any of aspects 1 through 19.

Aspect 31: A network entity, comprising: one or more memories storing processor-executable code; and one or more processors coupled with (e.g., operatively, communicatively, functionally, electronically, or electrically) the one or more memories and individually or collectively operable to execute the code (e.g., directly, indirectly, after pre-processing, without pre-processing) to cause the network entity to perform a method of any of aspects 20 through 27.

Aspect 32: A network entity for wireless communications, comprising at least one means for performing a method of any of aspects 20 through 27.

Aspect 33: A non-transitory computer-readable medium storing code for wireless communications, the code comprising instructions executable by one or more processors (e.g., directly, indirectly, after pre-processing, without pre-processing) to perform a method of any of aspects 20 through 27.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies, including future systems and radio technologies, not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed using a general-purpose processor, a DSP, an ASIC, a CPU, a GPU, an NPU, an FPGA or other programmable logic device, discrete gate or transistor logic, discrete hardware components, or any combination thereof designed to perform the functions described herein. A general-purpose processor may be a microprocessor but, in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Any functions or operations described herein as being capable of being performed by a processor may be performed by multiple processors that, individually or collectively, are capable of performing the described functions or operations.

The functions described herein may be implemented using hardware, software executed by a processor, or any combination thereof. Software shall be construed broadly to mean instructions, instruction sets, code, code segments, program code, programs, subprograms, software modules, applications, software applications, software packages, routines, subroutines, objects, executables, threads of execution, procedures, or functions, whether referred to as software, firmware, middleware, microcode, hardware description language, or otherwise. If implemented using software executed by a processor, the functions may be stored as or transmitted using one or more instructions or code of a computer-readable medium. Other examples and implementations are within the scope of the disclosure and appended claims. For example, due to the nature of software, functions described herein may be implemented using software executed by a processor, hardware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one location to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, phase change memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc. Disks may reproduce data magnetically, and discs may reproduce data optically using lasers. Combinations of the above are also included within the scope of computer-readable media. Any functions or operations described herein as being capable of being performed by a memory may be performed by multiple memories that, individually or collectively, are capable of performing the described functions or operations.

As used herein, including in the claims, "or" as used in a list of items (e.g., including a list of items prefaced by a phrase such as "at least one of" or "one or more of") indicates an inclusive list such that, for example, a list of at least one of A, B, or C means, e.g., A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on." As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

The term "determine" or "determining" or "identify" or "identifying" encompasses a variety of actions and, therefore, "determining" or "identifying" can include calculating, computing, processing, deriving, investigating, looking up (such as via looking up in a table, a database or another data structure), ascertaining and the like. Also, "determining" or "identifying" can include receiving (such as receiving information or signaling, e.g., receiving information or signaling for determining, receiving information or signaling for identifying), accessing (such as accessing data in a memory, or accessing information) and the like. Also, "determining" or "identifying" can include resolving, obtaining, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A user equipment (UE), comprising:
one or more memories storing processor-executable code; and
one or more processors coupled with the one or more memories and individually or collectively operable to execute the code to cause the UE to:
transmit first signaling indicating a requested location for inclusion of an error check portion within a plurality of bit channels for polar code construction, the requested location based at least in part on one or more decoding parameters of the UE;
receive a polar-encoded code block comprising a first data portion, a first error check portion, and a second data portion, the first error check portion following the first data portion and preceding the second data portion in accordance with a decoding order for the polar-encoded code block based at least in part on the requested location for inclusion of the error check portion; and
communicate second signaling based at least in part on a decoding process for the polar-encoded code block, the decoding process based at least in part on the first error check portion.

2. The UE of claim 1, wherein the one or more processors are individually or collectively further operable to execute the code to cause the UE to:
decode the first data portion according to a plurality of decoding paths corresponding to a first list size for successive cancellation list decoding; and
perform an error check for the first data portion using the first error check portion.

3. The UE of claim 2, wherein the one or more processors are individually or collectively further operable to execute the code to cause the UE to:
decode the second data portion according to one or more decoding paths corresponding to a second list size different from the first list size for the successive cancellation list decoding based at least in part on the error check for the first data portion.

4. The UE of claim 2, wherein the one or more processors are individually or collectively further operable to execute the code to cause the UE to:
select, from the plurality of decoding paths, a decoding path for the first data portion based at least in part on the error check for the first data portion; and
decode the second data portion based at least in part on the selected decoding path for the first data portion.

5. The UE of claim 2, wherein the one or more processors are individually or collectively further operable to execute the code to cause the UE to:
terminate the decoding process for the polar-encoded code block based at least in part on the plurality of decoding paths failing the error check for the first data portion.

6. The UE of claim 2, wherein the one or more processors are individually or collectively further operable to execute the code to cause the UE to:
reduce a quantity of bits associated with one or more log-likelihood ratio calculations for the decoding process based at least in part on the error check for the first data portion.

7. The UE of claim 1, wherein:
the polar-encoded code block further comprises a second error check portion following the second data portion in accordance with the decoding order for the polar-encoded code block; and
the decoding process is further based at least in part on the second error check portion.

8. The UE of claim 7, wherein, to transmit the first signaling, the one or more processors are individually or collectively operable to execute the code to cause the UE to:
transmit an indication of a capability of the UE to decode the polar-encoded code block comprising multiple error check portions, wherein the polar-encoded code block comprises the first error check portion and the second error check portion based at least in part on the capability of the UE.

9. The UE of claim 7, wherein, to transmit the first signaling, the one or more processors are individually or collectively operable to execute the code to cause the UE to:
transmit a request for inclusion of the second error check portion for the polar code construction, wherein the polar-encoded code block comprises the second error check portion based at least in part on the request.

10. The UE of claim 7, wherein the second error check portion verifies successful decoding of the first data portion, the second data portion, the first error check portion, or any combination thereof.

11. The UE of claim 10, wherein, to transmit the first signaling, the one or more processors are individually or collectively operable to execute the code to cause the UE to:

transmit an indication for the second error check portion to verify the first data portion, the second data portion, the first error check portion, or any combination thereof.

12. The UE of claim 1, wherein, to transmit the first signaling, the one or more processors are individually or collectively operable to execute the code to cause the UE to:

transmit an indication of a first quantity of bits for the error check portion, a second quantity of bits for a second error check portion, a total quantity of bits for a plurality of error check portions, or any combination thereof, wherein the polar-encoded code block is based at least in part on the first quantity of bits, the second quantity of bits, the total quantity of bits, or any combination thereof.

13. The UE of claim 12, wherein the first quantity of bits, the second quantity of bits, the total quantity of bits, or any combination thereof is based at least in part on a list size for successive cancellation list decoding at the UE.

14. The UE of claim 1, wherein, to transmit the first signaling, the one or more processors are individually or collectively operable to execute the code to cause the UE to:

transmit an indication of a plurality of candidate locations for inclusion of the error check portion and corresponding reductions in power consumption for the decoding process, the plurality of candidate locations comprising the requested location.

15. The UE of claim 1, wherein the one or more processors are individually or collectively further operable to execute the code to cause the UE to:

receive third signaling configuring a location for the error check portion within the plurality of bit channels for the polar code construction based at least in part on the requested location, wherein the polar-encoded code block comprises the first error check portion based at least in part on the configured location.

16. The UE of claim 1, wherein the one or more processors are individually or collectively further operable to execute the code to cause the UE to:

receive third signaling configuring a location for the error check portion within the plurality of bit channels for the polar code construction, wherein the first signaling is transmitted to request an update to the configured location.

17. The UE of claim 1, wherein the first signaling indicates the requested location based at least in part on a lookup table index, a bit channel index, a proportion of the plurality of bit channels, or any combination thereof.

18. The UE of claim 1, wherein the one or more decoding parameters comprise a list size for successive cancellation list decoding, a code rate for communications, a rank for communications, or any combination thereof.

19. The UE of claim 1, wherein the first error check portion comprises one or more cyclic redundancy check bits.

20. A network entity, comprising:

one or more memories storing processor-executable code; and one or more processors coupled with the one or more memories and individually or collectively operable to execute the code to cause the network entity to:

obtain first signaling indicating a requested location for inclusion of an error check portion within a plurality of bit channels for polar code construction, the requested location based at least in part on one or more decoding parameters of a user equipment (UE);

output a polar-encoded code block comprising a first data portion, a first error check portion, and a second data portion, the first error check portion following the first data portion and preceding the second data portion in accordance with a decoding order for the polar-encoded code block based at least in part on the requested location for inclusion of the error check portion; and communicate second signaling based at least in part on the polar-encoded code block.

21. The network entity of claim 20, wherein the one or more processors are individually or collectively further operable to execute the code to cause the network entity to:

select a location for the error check portion within the plurality of bit channels for the polar code construction based at least in part on the requested location; and output third signaling configuring the location for the error check portion based at least in part on the selecting, wherein the polar-encoded code block comprises the first error check portion based at least in part on the configured location.

22. The network entity of claim 21, wherein, to obtain the first signaling, the one or more processors are individually or collectively operable to execute the code to cause the network entity to:

obtain an indication of a plurality of candidate locations for inclusion of the error check portion and corresponding reductions in power consumption at the UE, the plurality of candidate locations comprising the requested location, wherein the location is selected based at least in part on the plurality of candidate locations, the reductions in power consumption, or both.

23. The network entity of claim 20, wherein the polar-encoded code block further comprises a second error check portion following the second data portion in accordance with the decoding order for the polar-encoded code block.

24. The network entity of claim 23, wherein the one or more processors are individually or collectively further operable to execute the code to cause the network entity to:

select a first quantity of bits for the first error check portion, a second quantity of bits for the second error check portion, or both, wherein the polar-encoded code block is based at least in part on the first quantity of bits, the second quantity of bits, or both.

25. The network entity of claim 24, wherein, to obtain the first signaling, the one or more processors are individually or collectively operable to execute the code to cause the network entity to:

obtain an indication of the first quantity of bits, the second quantity of bits, a total quantity of bits for a plurality of error check portions, or any combination thereof, wherein the selecting is based at least in part on the first quantity of bits, the second quantity of bits, the total quantity of bits, or any combination thereof.

26. The network entity of claim 20, wherein the one or more processors are individually or collectively further operable to execute the code to cause the network entity to:

obtain third signaling indicating that a second UE uses a successive cancellation decoder with a single decoding path; and select a location for the error check portion for the second UE based at least in part on the second UE using the successive cancellation decoder with the single decoding path.

27. The network entity of claim 20, wherein the first error check portion comprises one or more cyclic redundancy check bits.

28. A method for wireless communication at a user equipment (UE), comprising:

transmitting first signaling indicating a requested location for inclusion of an error check portion within a plurality of bit channels for polar code construction, the requested location based at least in part on one or more decoding parameters of the UE;

receiving a polar-encoded code block comprising a first data portion, a first error check portion, and a second data portion, the first error check portion following the first data portion and preceding the second data portion in accordance with a decoding order for the polar-encoded code block based at least in part on the requested location for inclusion of the error check portion; and communicating second signaling based at least in part on a decoding process for the polar-encoded code block, the decoding process based at least in part on the first error check portion.

29. The method of claim 28, further comprising:

decoding the first data portion according to a plurality of decoding paths corresponding to a first list size for successive cancellation list decoding; and performing an error check for the first data portion using the first error check portion.

30. A method for wireless communications at a network entity, comprising:

obtaining first signaling indicating a requested location for inclusion of an error check portion within a plurality of bit channels for polar code construction, the requested location based at least in part on one or more decoding parameters of a user equipment (UE);

outputting a polar-encoded code block comprising a first data portion, a first error check portion, and a second data portion, the first error check portion following the first data portion and preceding the second data portion in accordance with a decoding order for the polar-encoded code block based at least in part on the requested location for inclusion of the error check portion; and communicating second signaling based at least in part on the polar-encoded code block.

\* \* \* \* \*